US006639189B2

(12) United States Patent
Ramanan et al.

(10) Patent No.: US 6,639,189 B2
(45) Date of Patent: Oct. 28, 2003

(54) HEATING MEMBER FOR COMBINATION HEATING AND CHILLING APPARATUS, AND METHODS

(75) Inventors: Natarajan Ramanan, Plano, TX (US); James B. Sims, Dallas, TX (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 10/274,394

(22) Filed: Oct. 18, 2002

(65) Prior Publication Data

US 2003/0052118 A1 Mar. 20, 2003

Related U.S. Application Data

(63) Continuation of application No. 09/875,558, filed on Jun. 6, 2001, now Pat. No. 6,529,686.

(51) Int. Cl.⁷ .................................................. H05B 3/68
(52) U.S. Cl. .................... 219/444.1; 219/411; 219/390; 392/418
(58) Field of Search ................................. 219/390, 405, 219/411; 392/416, 418; 118/724, 725, 0.1

(56) References Cited

U.S. PATENT DOCUMENTS

| | | |
|---|---|---|
| 3,612,165 A | 10/1971 | Haynes |
| 3,956,936 A | 5/1976 | Brixy |
| 3,966,500 A | 6/1976 | Brixy |
| 4,030,015 A | 6/1977 | Herko et al. |
| 4,113,391 A | 9/1978 | Minowa |
| 4,443,117 A | 4/1984 | Muramoto et al. |
| 4,475,823 A | 10/1984 | Stone |
| 4,486,652 A | 12/1984 | Muka et al. |
| 4,627,744 A | 12/1986 | Brixy et al. |
| 4,903,754 A | 2/1990 | Hirscher et al. |
| 5,226,472 A | 7/1993 | Benevelli et al. |
| 5,252,807 A | 10/1993 | Chizinsky |
| 5,291,514 A | 3/1994 | Heitmann et al. |
| 5,410,162 A | 4/1995 | Tigelaar et al. |
| 5,411,076 A | 5/1995 | Matsunaga et al. |
| 5,484,011 A | * 1/1996 | Tepman et al. ............. 165/80.2 |
| 5,567,267 A | * 10/1996 | Kazama et al. ......... 156/345.27 |
| 5,584,971 A | * 12/1996 | Komino .................. 204/192.13 |
| 5,595,241 A | * 1/1997 | Jelinek ...................... 165/80.1 |
| 5,651,823 A | 7/1997 | Parodi et al. |
| 5,802,856 A | * 9/1998 | Schaper et al. ................ 62/3.7 |
| 5,889,261 A | * 3/1999 | Boardman .................... 219/543 |
| 5,892,207 A | * 4/1999 | Kawamura et al. .......... 219/492 |
| 6,072,163 A | * 6/2000 | Armstrong et al. .......... 219/497 |

OTHER PUBLICATIONS

Curran, L., "DSPs find a place in motor control," *Machine Design*, pp. 95–102 (Nov. 6, 1997).
PCT International Search Report for related PCT/US02/14335, completed Jul. 28, 20021.

* cited by examiner

*Primary Examiner*—Teresa Walberg
*Assistant Examiner*—Shawntina Fuqua
(74) *Attorney, Agent, or Firm*—Kagan Binder, PLLC

(57) ABSTRACT

Described are heating members and related methods, the heating members being usefully for processing substrates such as microelectronic devices, the heating members optionally and preferably comprising a thermal conductive layer prepared to a superior flatness and having thermal transfer properties that facilitate rapid, agile, and uniform heat transfer, with ceramic material being preferred for its construction, and the heating member optionally and preferably including a multi-layer heating element.

20 Claims, 18 Drawing Sheets

BAKE/PRIME POSITION

HEATING MEMBER FOR COMBINATION HEATING AND CHILLING APPARATUS, AND METHODS

This is a continuation of application Ser. No. 09/875,558, filed Jun. 6, 2001 now U.S. Pat. No. 6,529,686.

FIELD OF THE INVENTION

The present invention relates to heating members, heating elements, and to apparatuses useful for heating and cooling a workpiece that incorporate the heating members and heating elements, including bake/chill apparatuses and prime/chill apparatuses used in the manufacture of microelectronic devices. The heating members can be made to have a relatively high flatness, allowing improved efficiency and uniformity of heat transfer during processing.

BACKGROUND

The manufacture of many products requires precise control of temperature and temperature changes. For example, the manufacture of microelectronic devices such as integrated circuits, flat panel displays, thin film beads, and the like, involves applying a layer of some material, such as a photoresist, to the surface of a substrate such as a semiconductor wafer (in the case of integrated circuits). Photoresists, in particular, must be baked and then chilled to set or harden selected portions of the photoresist during processing. The baking and chilling steps must be precisely controlled within exacting temperature constraints to ensure that the selected portions of the photoresist properly set with good resolution. Nowadays, with the size of features becoming ever smaller and approaching sub-micron magnitudes, precise temperature and uniform heating of a workpiece become even more important.

Other products and processes involving precise temperature constraints include medical products and processes including drug preparation, instrument sterilization, and bioengineering; accelerated life testing methodologies; injection molding operations; piezoelectric devices; photographic film processing; material deposition processes such as sputtering and plating processes; micromachine manufacture; ink jet printing; fuel injection; and the like.

Baking and chilling operations for microelectronic devices typically involve cycling a workpiece through a desired temperature profile in which the workpiece is maintained at an elevated equilibrium temperature, chilled to a relatively cool equilibrium temperature, and/or subjected to temperature ramps of varying rates (in terms of ° C./s) between equilibrium temperatures. To accomplish baking and chilling, some previous bake/chill operations have included separate bake and chill plates that require the use of a workpiece transport mechanism to physically lift and transfer the workpiece itself from one plate to another. This approach presents a number of drawbacks. First, workpiece temperature is not controlled during transfer between bake and chill plates. Second, the overall time required to complete the bake/chill process cannot be precisely controlled, because of the variable time required to move the workpiece to and from the respective plates. Third, the required movement takes time and thus reduces the throughput of the manufacturing process. Fourth, the cost of equipment includes the cost of components for handling the workpiece during transport from plate to plate. Fifth, the mechanical move from plate to plate introduces the possibility of contaminating of the workpiece. Thus, it is desirable to be able to accomplish both baking and chilling without having to physically lift and transport a workpiece from a heating member to a separate chill plate and vice versa.

A more recent approach of temperature control is described in U.S. Pat. No. 6,072,163, entitled "Combination Bake/Chill Apparatus Incorporating Low Thermal Mass, Thermally Conductive Bakeplate." The patent describes methods that use a single apparatus having a low thermal mass heating member that supports a workpiece during both baking and chilling operations. While supporting the workpiece on one surface, the other surface of the heating member can be brought into and out of thermal contact with a relatively massive chill plate to easily switch between baking and chilling. A simple mechanism is used to physically separate the heating member and chill plate to effect rapid heating, or to join the heating member and the chill plate to effect rapid cooling. This approach eliminates the need to rely on workpiece handling to lift and transfer a workpiece from the heating member to a separate chill plate, and advantageously allows both chilling and baking to occur from a direction below the workpiece.

SUMMARY OF THE INVENTION

In bake and chill operations involving an apparatus with the combined ability to heat and cool, e.g., a bake/chill apparatus or a prime/chill apparatus, precise flatness has been found to be an important feature of the heating member. A typical gap between a supporting surface of a heating member and a workpiece supported by the heating member can be on the scale of several thousandths of an inch, e.g., less than six thousandths of an inch. It is important that the span of that gap be uniform over the entire area between the heating member and the workpiece so that heat is uniformly transferred between the two.

As an example of the effect of non-uniform heat transfer, consider the deposition of a reactive chemical layer such as a photoresist onto a microelectronic device. As noted above, finer and finer features are being placed on microelectronic devices, down to 0.13 microns and smaller. With continued reduction in feature size comes an attendant reduced tolerance for process non-uniformities. With smaller features, influences that in the past have had negligible effects on final quality of a processed workpiece become important. In the case of a photoresist used to produce such extremely small features, the temperature sensitivities of the photoresist may influence final product quality. Specifically, non-uniform temperatures across a layer of photoresist, even to a minute degree, can result in non-uniform thickness of a deposited photoresist layer or non-uniformity in the size of developed features, due to non-uniform solvent evaporation, or non-uniform reaction kinetics, e.g., development, chemical amplification, or photochemical reactions of a photoresist. These non-uniform processes, even if minutely small, can cause non-uniformities and imperfections in the details, e.g., feature sizes, of articles produced using the chemistries. Any methods of improving uniformity of heating a workpiece can improve product quality and reduce rejected products.

Another variable that can affect reaction kinetics, feature size, and uniformity, and ultimately the quality of manufactured products is the timing of heating and chilling processes. Many chemical reactions are temperature sensitive, meaning that they are designed to occur at a specific temperature. Optimum temperature control will involve a very rapid heating of a workpiece and its chemistry (e.g., photoresist) to the desired temperature, which will minimize the amount of time spent at a less-optimum temperature, and maximize the time spent reacting at the desired temperature.

Overall, this increases the precision of the reaction and the uniformity of the reacted chemistry. Properties of a heating member that allow rapid, precise heating and cooling are particularly desirable. Agility in heating and cooling performance is desirable and very useful to provide high throughput and quality of workpieces.

It has been found that a high degree of uniformity in heating a workpiece can be achieved by selecting a low thermal mass heating member to have one or more of: an extreme degree of flatness of the supporting surface; high thermal conductivity of the thermally conductive layer; independent zones of temperature control; and a thermally conductive layer that has rigidity, stiffness, and thermal properties to achieve the desired flatness and thermal conductivity. Improved uniformity in heating a workpiece can improve the uniformity of chemical processing (e.g., solvent evaporation or chemical reactions) over the surface area of the workpiece, which improves the uniformity of feature sizes and ultimately increases product quality and yield.

Typical processes that have been used in constructing heating members have involved subjecting heating member materials to high pressures. In the past, heating members have been prepared from a number of layers such as metal layers and a heating element bonded together using high pressure and temperature. Many materials that have been used for layers of the heating member, such as metals like aluminum, have a relatively high flexibility. High pressures used in constructing the heating member have tended to adversely affect the heating member's final flatness. As an example, bonding a heating element to a thin, flat aluminum sheet has been found to cause deformation of up to one one-hundredth of an inch in the aluminum sheet. The result is a reduced flatness or a warping of the heating member as a whole, which during use causes a non-uniform gap between the heating member and a workpiece. This in turn causes non-uniform heating of the workpiece by the heating member. As an additional challenge, the properties of metals include relatively low rigidity and relatively high flexibility, generally making it difficult to produce metal sheets that are both thin and flat to begin with.

It has now been discovered that low thermal mass heating members can be constructed of relatively more rigid ceramic materials that do not suffer from the same dimensional instability and can be constructed to a relatively greater degree of flatness, and can at the same time be selected to have desired thermal properties such as low thermal mass and high, uniform thermal conductivity. Useful ceramic materials typically have a rigidity as measured by Young's Modulus of at least 200 gigapascals, more preferably greater than about 400 gigapascals, which allows processing to preferred degrees of flatness. Preferred degrees of flatness may be less than about 0.01 inch, more preferably less than about 0.005 inch or even about 0.002 inch or less.

Preferred heating members can include a ceramic thermally conductive layer having a precise flatness, bonded to a heating element. A heating member can, for example, be constructed of a single rigid ceramic layer finished on one surface to a very high degree of flatness, and bonded on the other surface to a heating element. In another embodiment, the heating member can include two ceramic layers that sandwich a heating element between them. These heating members can be manufactured and assembled using techniques that do not significantly adversely reduce flatness of the ceramic thermally conducive layer, to produce a heating member of superior flatness which in use advantageously provides more uniform heat transfer than heating members with inferior flatness. The ceramic may also have additional advantageous properties for use in a combination bake/chill apparatus, such as one or more of a relatively low heat capacity (and therefore a low thermal mass) and high thermal conductivity.

One type of preferred ceramic material that can provide one or more of these advantages includes materials known as silicon carbides, especially silicon carbide having a purity in excess of 95 percent by weight, such as silicon carbide of greater than 97 weight percent purity, e.g., at least 98 or 99 weight percent purity, and even up to 99.999 weight percent purity or above. Such high purities offer improved uniformity and more uniform heat transfer properties. The thermally conductive layer may be made of other materials as well, especially other ceramics such as aluminum nitride (AlN), beryllium copper, beryllium, graphite foam, and like materials having preferred rigidity and thermal properties.

Other advantages of the inventive heating member may include one or more of the following. Improved flatness may eliminate the need to pull vacuum to pressure the workpiece against the heating member, which is sometimes used with other heating members (the use of vacuum may still be useful or desirable). This can reduce the complexity of the heating member itself and of an apparatus that uses the heating member. Also, the number of protuberances placed on a surface of the heating member to support a workpiece above the surface of the heating member may be reduced, or the need for protuberances may even be eliminated, allowing for more efficient heat transfer.

Preferred heating members of the invention can include a multi-layer heating element, meaning a heating element that includes heating element segments separated into two or more layers of the heating element. (Of course, single-layer heating elements may be useful.)

A preferred heating member may include the following: one or more thermally conductive layers (one on top including a workpiece supporting surface, and optionally a second thermally conductive layer opposite the heating element, which may be placed in thermal contact with a chill plate); a heating element optionally and preferably including multiple layers, each containing one or more heating element segment; adhesives; and may further additionally include optional components such as temperature sensors (optionally and preferably as a layer of the heating element), or others, as will be appreciated by the skilled artisan. A ground layer may be preferred to separate layers of an electrically resistive heating element segment from layers of temperature sensors.

Preferred embodiments of the invention can incorporate control equipment and methods that are able to precisely and accurately control temperatures of the heating member and the workpiece throughout heating and chilling steps, to make sure that the exacting temperature specifications for workpiece production are satisfied. For example, if heating or chilling rates as fast as 1° C./s to 50° C./s, preferably 5° C./s to 15° C./s, are used, the control system can be agile enough to control the workpiece temperature commensurately with such rapid temperature changes.

An aspect of the invention relates to a low thermal mass heating member that includes a thermally conductive layer having a supporting surface with a flatness of less than 0.01 inch. The thermally conductive layer also has an opposing surface in thermal contact with a heating element.

Another aspect of the invention relates to a low thermal mass heating member that includes a heating element in thermal contact with a thermally conductive layer, wherein the thermally conductive layer includes silicon carbide having a purity of at least about 98 percent by weight.

Another aspect of the invention relates to a low thermal mass heating member that includes a heating element in thermal contact with a thermally conductive layer, and the thermally conductive layer is aluminum nitride. The thermally conductive layer can consist of aluminum nitride, or can consist essentially of aluminum nitride.

Another aspect of the invention relates to a low thermal mass heating member that includes a multi-layer heating element in thermal contact with a thermally conductive layer. The multi-layer heating element includes multiple electrically resistive heating element segments, and at least two different layers of the multi-layer heating element each contain a heating element segment.

Yet another aspect of the invention relates to a multi-layer heating element. The multi-layer heating element includes multiple electrically resistive heating element segments, and at least two different layers of the multi-layer heating element each contain a heating element segment. The heating element can preferably be substantially flat and can be used for heating flat substrates.

Yet another aspect of the invention relates to a heating member that includes: a thermally conductive silicon carbide layer having a supporting surface with a flatness of less than 0.01 inch, wherein the silicon carbide has a thermal conductivity of at least 100 watts/(meter degree Kelvin); and a multi-layer heating element in thermal contact with an opposing surface of the silicon carbide layer, wherein the multi-layer heating element includes multiple electrically resistive heating element segments, and wherein at least two different layers of the multi-layer heating element each contain one or more heating element segments.

Still another aspect of the invention relates to an apparatus suitable for controlling the temperature of a workpiece. The apparatus includes: (a) a low thermal mass, thermally conductive heating member having a workpiece supporting surface adapted for supporting the workpiece in thermal contact with the heating member such that heat energy from the heating member can be transferred to the workpiece, the supporting surface of the heating member having a flatness of less than 0.01 inch; and (b) a high thermal mass chilling member. The apparatus supports the heating member and the chilling member in at least a first configuration in which the chilling member is in thermal contact with the heating member.

Still another aspect of the invention relates to an apparatus suitable for controlling the temperature of a workpiece. The apparatus includes: (a) a low thermal mass, thermally conductive, heating member that includes a ceramic thermally conductive layer having a workpiece supporting surface adapted for supporting the workpiece in thermal contact with the heating member such that heat energy from the heating member can be transferred to the workpiece, the ceramic layer being silicon carbide of at least about 98 percent by weight purity; and (b) a high thermal mass chilling member. The apparatus supports the heating member and the chilling member in at least a first configuration in which the chilling member is in thermal contact with the heating member.

Still a further aspect of the invention relates to an apparatus suitable for controlling the temperature of a workpiece. The apparatus includes: (a) a low thermal mass, thermally conductive, heating member comprising a thermally conductive layer having a workpiece supporting surface and an opposing surface, the workpiece supporting surface being adapted for supporting the workpiece in thermal contact with the heating member such that heat energy from the heating member can be transferred to the workpiece, the opposing surface being in thermal contact with a multi-layer heating element that includes multiple electrically resistive heating element segments, wherein at least two different layers of the multi-layer heating element each contain a heating element segment; and (b) a high thermal mass chilling member. The apparatus supports the heating member and the chilling member in at least a first configuration in which the chilling member is in thermal contact with the heating member.

Still another aspect of the invention relates to a combination bake/chill apparatus that includes a low thermal mass heating member having a silicon carbide thermally conductive layer of at least about 98 weight percent silicon carbide and having a surface having a flatness of less than 0.01 inch.

Still another aspect of the invention relates to a combination prime/chill apparatus that includes a low thermal mass heating member having an aluminum nitride thermally conductive layer comprising a surface having a flatness of less than 0.01 inch.

DETAILED DESCRIPTION

Figure 1A:
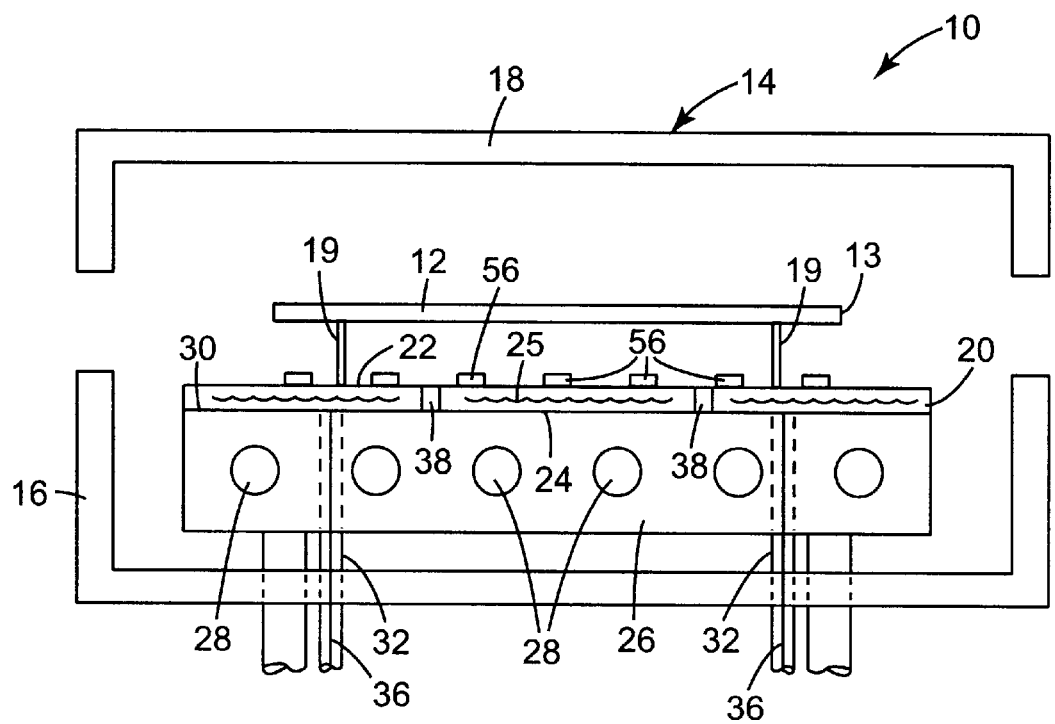
FIG. 1a is a schematic representation of a bake/chill apparatus of the present invention shown in side view in a "ready" configuration.

The invention relates to low thermal mass heating members comprising a heating element in thermal contact with a thermally conductive layer. The thermally conductive layer has a supporting surface for supporting a workpiece during processing, and a second, opposing, surface adjacent to the heating element. According to the invention, the material chosen for the construction of the thermally conductive layer is a material having one or more properties selected from relatively high rigidity, an ability to be processed to precise flatness, high thermal conductivity, relatively low heat capacity, and relatively low thermal mass.

It has been discovered that precise flatness of the supporting surface of a heating member thermally conductive layer can provide improved processing of a workpiece due to improved uniformity of thermal transfer between the heating member and the workpiece. When processing a workpiece using a heating member, a typical gap between a supporting surface of a heating member and a workpiece supported by the heating member can be on the scale of several thousandths of an inch, e.g., less than six thousandths of an inch. It is important that the span of that gap be as uniform as possible over the entire area between the heating member and the workpiece, so that heat energy is uniformly transferred between the two during heating and cooling. Uniform heat transfer over the area of the heating member provides optimal processing, for example in processing chemicals deposited on a surface of a workpiece, because uniform heat transfer results in uniform behavior of the chemicals, specifically including uniform solvent evaporation and uniform reaction rates over the surface area of the workpiece. Due to the small feature sizes of some types of today's workpieces, the avoidance of even minute thermal non-uniformities across the area of a substrate during processing can provide noticeably improved product quality of processed workpieces.

Thus, according to the invention, a heating member can include a supporting surface having a flatness of less than 0.01 inches. Preferred heating members can have a supporting surface flatness that is less than 0.005 inches, more preferably less than 0.002 inches. This flatness can be measured by understood methods of which one is described at the end of this description, and can most conveniently be measured at a time soon after the heating member is produced, but may also be measured at a later time, e.g., during installation or use of the heating member in an apparatus for heating and chilling.

The thermally conductive layer, to have desired flatness and efficient heat-conducting properties, can preferably be made of a ceramic material having relatively high rigidity. To achieve other desired thermal properties, the ceramic can further exhibit high thermal conductivity and low thermal capacity (thermal capacity is also referred to herein as "thermal mass").

Relative rigidity of the conductive layer allows the production of a thermally conductive layer having a precise of flatness. Rigidity can be measured as Young's Modulus, which is a known measurement that can be performed by various standard tests and using various known methods and equipment. Preferred thermally conductive layers can have a Young's Modulus that is at least about 200 gigapascals, e.g., 300 or 400 gigapascals. For example, preferred silicon carbide materials for use in a thermally conductive layer of the invention can have a Young's Modulus of 410 gigapascals or more. Aluminum nitride can have a Young's Modulus of at least about 344 gigapascals.

The heating member also preferably has a relatively low thermal mass or thermal capacity. A low thermal mass can be a thermal mass that allows a workpiece supported by the heating member to be placed in thermal contact with a chilling member through the heating member, e.g., a chilling member can chill the workpiece from below the heating member and through the heating member, even if the heating member is to some extent heating the workpiece. Examples of heating members with low thermal mass are described in U.S. Pat. No. 6,072,163, the entirety of which is incorporated herein by reference. Stated differently, "low thermal mass" can mean that the thermal capacity of a heating member is, at most, about the same order of magnitude as the thermal mass of the workpiece being processed. Preferably, the ratio of the thermal mass of a heating member to the workpiece is in the range from about 1:100 to about 5:1, preferably 1:10 to about 2:1.

"Thermal mass" refers to the amount of energy required to raise the temperature of a body by 1° C. For example, thermal mass, Q, for solid bodies such as a workpiece, (e.g., a semiconductor wafer), a heating member, or a cooling member, may be represented by the formula $$Q = MC_p \qquad (I)$$

wherein M is the mass of the body in kg and $C_p$ is the average heat capacity (J/kg-° C.) of the body over a desired temperature range.

A preferred heat capacity, $C_P$, of ceramic materials may be less than about 1000 Joules per degree C-Kg (J/° C.-Kg), more preferably less than about 500 J/° C.-Kg. The heat capacities of many ceramic materials are known and available in reference literature or can be measured by known methods.

Generally, the mass of a heating member can be in the range from about 500 grams to about 1500 grams, e.g., about 1000 grams.

Formula I shows that thermal mass, Q, is related to the mass of the heating member, which is of course related to the size, e.g., thickness and diameter. Preferred heating members of the invention can have a thermal mass that is significantly less than the thermal mass of thermally conductive layers of conventional heating members, which typically exceed 5000 joules per degree Celsius (J/C) (for use with a 300 mm diameter substrate). For example, the thermal mass of a low thermal mass heating member of the invention can be less than 2000 J/C, preferably less than 1000 J/C and more preferably less than 500 J/C. These values are for heating members having a diameter of from about 8 to 13 inches and a thickness of preferably less than 0.5 inch, more preferably from about 0.06 to 0.25 inch. The thermal mass of the heating member is typically mostly due to the thermally conductive layer or layers, and the heating element portion of the heating member is typically only a small fraction of the total thermal mass of the thermally conductive layer, e.g., less than about 10 or 5 percent, or less than even 1 percent.

Low thermal mass, preferably combined with high thermal conductivity, is desirable in a heating member thermally conductive layer to facilitate efficient and rapid heating and cooling of a workpiece. This can be particularly advantageous in the operation of a combination bake/chill or prime/chill apparatus, during a chill step, when thermal energy flows from the workpiece to the chill apparatus through the low thermal mass thermally conductive heating member.

The thermally conductive layer serves as a structural ply to support and protect the other layers of a heating member, and also facilitates both lateral and vertical heat conduction through a heating member to facilitate uniform heating of a workpiece supported at a surface of the heating member. Accordingly, in addition to the above-described preferred properties, a thermally conductive layer can preferably be made from a suitable material, or combination of materials, that structurally support the other layers of a heating member as well as withstand the temperature changes of heating and chilling operations without substantial distortion, sagging, wrinkling, loss of tension, or other undesirable degradation. As discussed elsewhere in this description, either one or two (or more, if desired) thermally conductive layers may be included in a heating member of the invention, e.g., one on top, and optionally a second on the bottom.

The thickness of a thermally conductive layer can depend on various factors, such as its composition, thermal properties, the nature of the other elements of the heating member, such as the heating element, and the number and compositions of thermally conductive layers included in a heating member. Functionally speaking, a thermally conductive layer should be thick enough, based on its inherent rigidity, to provide desired structural integrity and rigidity and stiffness to the heating member. On the other hand, it should be thin enough to allow the efficient flow of heat energy through the heating member, and still be kept to a relatively low thermal mass. A thermally conductive layer should be thin enough to have a relatively low thermal mass to allow cooling and heating effects to be rapidly imparted through the thermally conductive layer to a supported workpiece. However, if the thermally conductive layer or layers is or are too thin, the mechanical strength and durability of the heating member may be poor, resulting in a relatively short service life. Lateral conductivity, and hence heating uniformity, also decrease with decreasing thickness, while thicker thermally conductive layers may tend to have better lateral thermal conductivity properties and may tend to provide more uniform heating of a supported workpiece. However, if the thermally conductive layer or layers are too thick and massive, they would constitute more thermal mass, slowing down the rate at which a supported workpiece could be heated and cooled.

Balancing these concerns, a heating member preferably includes one or two thermally conductive layers, one on the upper workpiece supporting surface, and the other, optionally on the opposite surface able to be placed in thermal contact with a chilling station. The thickness of the one or two thermally conductive layers will depend on various factors, including the composition of the thermally conductive layers and whether one or two (or possibly even more) are included in the heating member. Preferred thicknesses will result in a heating member having a total thickness preferably of less than 0.25 inches, more preferably less than 0.125 inch. Thus, preferred thicknesses of individual thermally conductive layers can be in the range from about 40 mils to 0.125 inches. For a heating member having two thermally conductive layers, the thickness of each layer is preferably no greater than about 0.10 inches, preferably from about 0.04 to about 0.08 inches, such that the total thickness of the heating member is less than 0.25 inches, preferably less than about 0.125 inches. For a heating member having only a single, thermally conductive layer with a workpiece supporting surface, the thickness may be twice as great or more, preferably from about 0.10 inch up to about 0.20 inches thick, again, to result in a total thickness of the heating member of less than 0.25 inches, preferably less than about 0.125 inches.

Materials useful in the thermally conductive layer include ceramics that are able to be processed to have a precise flatness, materials which have preferred thermal properties, and preferably, materials that exhibit a combination of being able to be processed to a precise flatness and preferred thermal properties.

Many ceramic materials can be processed to a precise degree of flatness. One specific type of ceramic is the class of ceramic materials containing silicon carbide (SiC). Preferred thermally conductive layers of the invention can include silicon carbide, with particularly preferred thermally conductive layer being made of, i.e., consisting of or consist essentially of, silicon carbide of various purities.

Silicon carbide comes in more than one form. The different forms can be characterized, among other things, based on their purity or their heat transfer properties, the two being somewhat related. According to the invention, preferred silicon carbide materials can be of a relatively high purity of silicon carbide, can have relatively high thermal conductivity, and can be of a highly uniform silicon carbide composition, which means that the relatively high thermal conductivity is substantially uniform over the surface area of the thermally conductive layer.

One type of silicon carbide is commonly referred to as reaction-bonded silicon carbide. Reaction-bonded silicon carbide is commercially available, for example, from Alumina Ceramics, Inc., of Benton Ark., among other places. Reaction bonded silicon carbide typically has a purity of up to about 97.5 percent by weight, e.g., in the range from about 95 to about 97 percent silicon carbide. At these purity levels, the silicon carbide materials typically have a thermal conductivity of less than about 100 watts per meter degree K (w/(mK)). Thus, while silicon carbide of the type and purity of reaction bonded silicon carbide may be useful according to the invention, other types of silicon carbide having relatively higher purity and higher and more uniform thermal conductivity can be preferred.

A second type of silicon carbide is the type commonly referred to as sintered silicon carbide. This type too is commercially available from Alumina Ceramics, Inc., and elsewhere. Sintered silicon carbide generally has a purity of at least 98 percent by weight, with trace elements including boron, free carbon, nickel, vanadium, iron, and others. Sintered silicon carbide can often have a thermal conductivity in the range from about 100 to about 150 w/(mK).

Yet another type of silicon carbide is the type commonly referred to as "CVD" silicon carbide, or chemical vapor deposition silicon carbide. CVD silicon carbide generally has a purity of at least 99 percent by weight, and even extremely high purities up to or exceeding 99.999 percent by weight, including or exceeding 99.9995 percent by weight. CVD silicon carbide often has a thermal conductivity that exceeds 150 w/(mK), e.g., up to about 300 w/(mK). CVD silicon carbide is commercially available, for example from Rohm and Haas among other places.

Other materials useful in thermally conductive layers may include other ceramics such as aluminum nitride (AlN); beryllium copper (Be 90–95%, Cu 5–10%); Be—Cu, usually coated, e.g., with nickel; beryllium, which might be used by itself except that it is dangerously toxic; graphite foam (commercially available from Poco Graphites, Decateur, Tex.); and like materials.

Materials such as those ceramics described above can be prepared into flat, thermally conductive layers by methods that are known and understood in the bakeplate and materials arts. Ceramic materials, for example, can be molded, machined, heat processed (e.g., sintered or baked), ground, lapped, and otherwise processed to a uniformly thick and flat thermally conductive layer having a supporting surface with a flatness of 0.01 inch, 0.005 inch, or 0.002 inch, or less.

For silicon carbide materials in particular, any of a variety of processing methods may be used, depending, e.g., on the variety of silicon carbide chosen. Reaction bonded silicon carbide begins as solid silica, and carbon is diffused into the silica. This solid material can be machined into a flat plate, which can optionally be further machine lapped or hand lapped to an even finer finish. Sintered silicon carbide starts as a powder that can be molded into a relatively flat and uniformly thick plate. That plate can be further machined, ground, and hand or machine lapped to a very flat surface. CVD silicon carbide starts as a solid that can be machined, ground, and lapped to a plate having a very flat surface.

The heating member further includes a heating element that can be of any known material useful to rapidly and precisely produce heat, normally based on electrical resistance. Preferred heating elements for use in the heating member of the invention are relatively thin and can most preferably have high thermal conductivity and low thermal mass. Such heating elements are generally well known in the arts of heating members and bakeplates.

Preferred heating members can include multiple heating zones. In these preferred embodiments, a heating element contains multiple heating element segments, with one or more segment corresponding to a different heating zone of the heating member. Most preferably, each separate heating element segment can be individually connected, through separate sets of electrical leads, to a separate temperature control mechanism (but commonly connected to a single process control device).

Thus, a preferred heating member of the invention may include the following: one or more thermally conductive layers (one on top including a workpiece supporting surface, and optionally a second thermally conductive layer opposite the heating element, which may be placed in thermal contact with a chill plate); a heating element optionally and preferably including multiple layers each containing one or more heating element segment; adhesives; and may further additionally include optional components, such as temperature sensors, as will be appreciated by the artisan of ordinary skill.

An example of an optional component may include a temperature monitoring element such as an RTD, or resistance temperature detector. Another example of an optional component may include an electrical ground layer which when an electrically insulating ceramic is used as a thermally conductive layer, acts as a safety ground for the heating member. Also, if placed between a heating element and a temperature monitoring element, the ground layer can shield the temperature monitoring element from electromagnetic radiation from the heating element layers that may produce noise and inaccurate readings in the temperature monitoring element. The ground layer may be of any conductive material, and is preferably a highly conductive material such as copper.

A different optional component is a dielectric or insulative layer that can be placed between different electrically conductive layers to provide for electrical insulation, and in a different mode, may be placed between one or two layers that have relatively textured or rough surfaces to prevent contact between those surfaces. Thermally conductive, electrically insulating temperature-stable adhesive layers are normally used to bind individual layers together.

The thermally conductive layer or layers can be combined with a heating element and other optional components of a heating member, and assembled into a heating member by known methods. According to one approach for forming a heating member from a heating element and one or more thermally conductive layers, individual layers to be laminated together are registrably stacked together, including the layers of a heating element (e.g., adhesives and one or more layers containing electrically resistive heating element segments), optionally a grounding plate or ground layer, optionally one or more temperature sensors, and one or more thermally conductive layers. Locating pins may be registrably positioned through the stacked layers to help achieve proper alignment as the layers are stacked together. The stack of layers is then placed in a vacuum bag and wrapped in fiberglass fabric to prevent thermally conductive layers from being damaged. A vacuum is drawn, the layers are pressed together in an autoclave at a pressure of 350 psi (24 bars), and the assembly is heated at 350° C. for a time (typically 2 to 24 hours) sufficient to effectively bond the layers together.

The heating member may be useful in apparatuses useful for heating and chilling workpieces including microelectronic components. Such apparatuses include, for example, combination bake/chill apparatuses and combination prime/chill apparatuses. The phrase "combination bake/chill apparatus" means an apparatus that combines a low thermal mass heating member that supports a workpiece during both baking and chilling operations, such as those of the type described in U.S. Pat. No. 6,072,163, entitled "Combination Bake/Chill Apparatus Incorporating Low Thermal Mass, Thermally Conductive Bakeplate." While supporting the workpiece on one surface, the other surface of the heating member can be brought into and out of thermal contact with a relatively more massive chill plate to easily switch between baking and chilling. A simple mechanism is used to physically separate the heating member and chill plate to effect rapid heating, or to join the heating member and the chill plate to effect rapid cooling. This approach eliminates the need to rely on workpiece handling to lift and transfer the workpiece from the heating member to a separate chill plate, and advantageously allows both chilling and baking to occur from a direction below the workpiece.

Figure 1B:
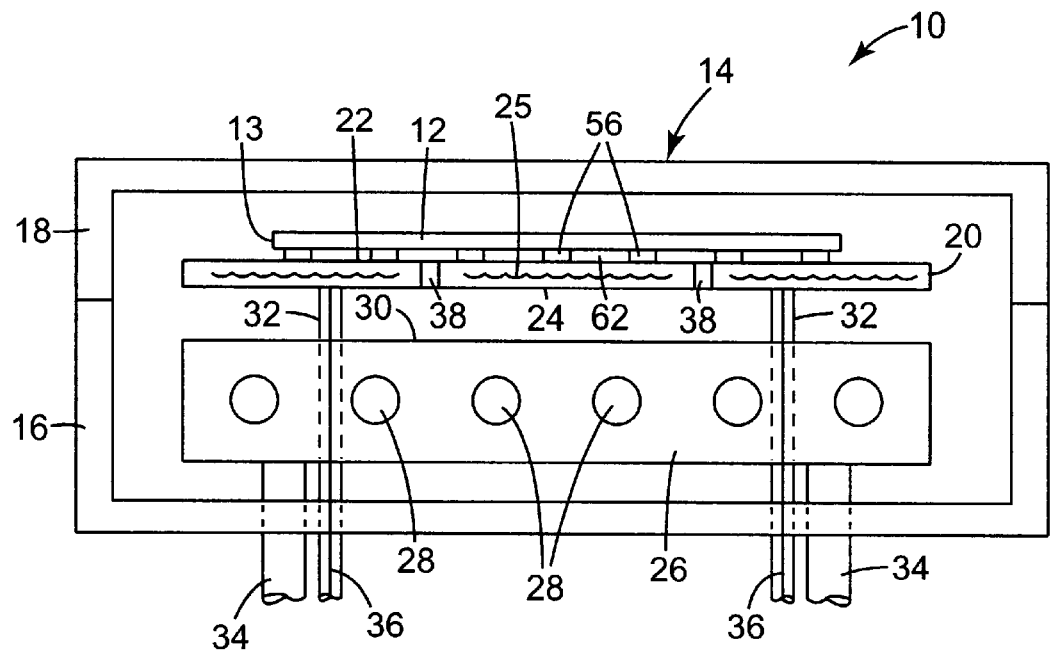
FIG. 1b is a schematic representation of a bake/chill apparatus of the present invention shown in side view in a "baking" configuration.
Figure 1C:
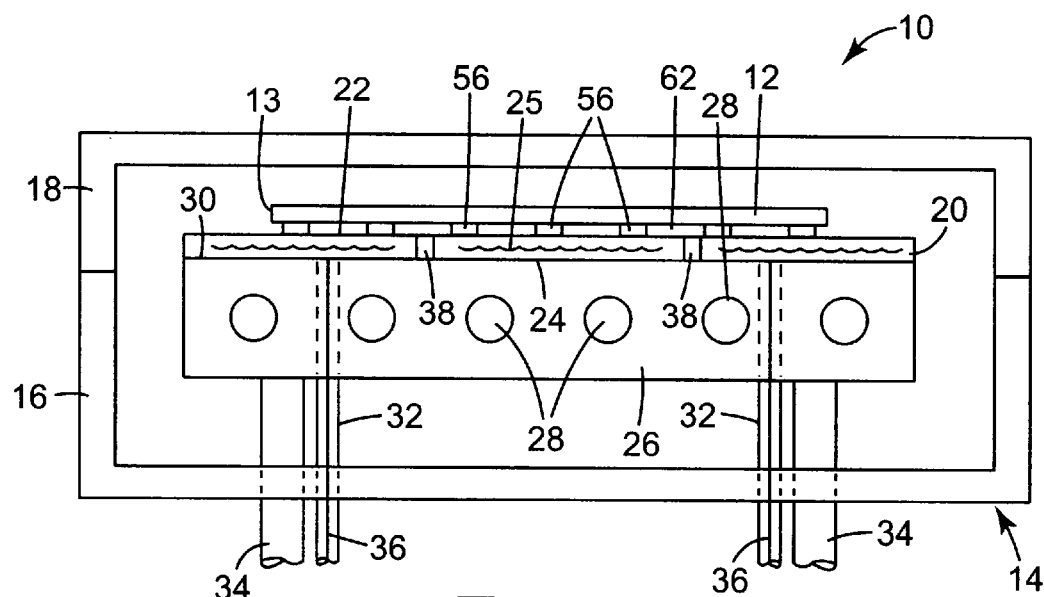
FIG. 1c is a schematic representation of a bake/chill apparatus of the present invention shown in side view in a "chilling" configuration.

FIGS. 1a, 1b, and 1c schematically represent three configurations, respectively, of a preferred embodiment of a combination baking and chilling apparatus 10 (hereinafter also referred to as "bake/chill apparatus 10") suitable for cycling a workpiece such as semiconductor device 12 through a temperature profile comprising at least one baking step and at least one chilling step. Bake/chill apparatus 10 includes housing 14 having bottom housing member 16 and top cover 18. Bottom housing member 16 and top cover 18 can be separated from each other as shown in FIG. 1a or brought together as shown in FIGS. 1b (baking configuration) and 1c (chilling configuration) to repeatedly open and close housing 14. When housing 14 is open, semiconductor device 12 may be inserted into housing 14 and placed on stationary support pins 19 in preparing for baking and chilling.

After the wafer 12 has been inserted into housing 14, housing 14 can be closed as shown in FIGS. 1b and 1c, to provide a closed, environmentally sealed processing chamber having a volume that is preferably sufficiently small to substantially avoid thermal convection currents that might otherwise arise during baking and chilling. Environmental sealing also protects the processing chamber and its contents from contaminants and allows the processing chamber to be more effectively purged with a gas (if it is desired to carry out processing in a special atmosphere) or evacuated (if it is desired to carry out processing in a vacuum or a partial vacuum), as desired.

Housing 14 contains a relatively low thermal mass, thermally conductive heating member in the form of bakeplate 20 and a relatively high thermal mass heat sink in the form of cooling member 26. As used herein, "high thermal mass" means that the thermal capacity of cooling member 26 is at least about an order of magnitude greater than that of either bakeplate 20 or the workpiece. Preferably, the ratio of the thermal capacity of cooling member 26 to that of either bakeplate 20 and/or the workpiece is at least 10:1 and more preferably is 10:1 to 100:1, more preferably 30:1 to 50:1.

Bakeplate 20 has a first major surface 22 for supporting semiconductor device 12 such that heat energy from bakeplate 20 can be transferred to semiconductor device 12 during baking. Bakeplate 20 also includes second major surface 24 which can be placed into thermal contact with cooling member 26. "Thermal contact" means that bakeplate 20 and cooling member 26 are in sufficiently close proximity that cooling effects of cooling member 26 can be imparted to semiconductor device 12 through bakeplate 20. The most rapid cooling occurs when second major surface 24 is in direct physical contact with cooling member 26 as shown in FIG. 1c. However, effective cooling can still occur even when there is some physical separation, e.g., up to about 3 mm in preferred embodiments, between bakeplate 20 and cooling member 26.

Bakeplate 20 includes one or more heating elements (sections of which may be referred to as "heating element segments," if more than one is present) preferably in the form of resistive heating element (not specifically shown) of the type in which the amount of electrical energy supplied to the heating element by electrical connects 36 is converted into a corresponding amount of thermal energy. Because bakeplate 20 has relatively low thermal mass and is thermally conductive, beat energy released in bakeplate 20 is quickly transferred to semiconductor device 12.

In terms of surface area, the area of the heating element in contact with the thermally conductive layer, e.g., the total area of all heating element segments, is preferably larger than semiconductor device 12 to ensure that heating element segments not only underly wafer 12 but also extend beyond edge 13 of wafer 12.

Cooling member 26 has relatively high thermal mass as compared to semiconductor device 12 and bakeplate 20. Cooling member 26 thus serves as a thermally massive heat sink and can be maintained at any desired cooling temperature effective to provide chilling, e.g., 15° C. to 23° C. being typical. Via thermal conduction, bakeplate 20, and hence wafer 12, are rapidly chilled when bakeplate 20 is placed into thermal contact with cooling member 26. Cooling member 26 may optionally include cooling channels 28 that pass through the interior of cooling member 26. This allows cooling member 26 to be maintained at the desired cooling temperature by circulating chilled cooling media, e.g., water or the like, through cooling channels 28. The chilling media may include an anticorrosion agent in order to protect cooling member 26 from corrosion.

In preferred embodiments, cooling member 26 can be formed from a corrosion resistant, thermally conductive metal such as aluminum, stainless steel, copper, combinations of these, or the like. If cooling member 26 is made from copper, the copper preferably includes a coating, such as Ni, that protects the copper from corrosion and also prevents copper ions from contaminating wafer 12. If cooling member 26 is made from aluminum, the aluminum can be passivated with a coating, such as a coating comprising aluminum oxide impregnated with polytetrafluoroethylene or the like, that protects the aluminum against corrosion.

Of course, this embodiment of cooling member 26 is merely preferred, and other kinds of cooling structures and devices can also be useful. For example, instead of using a liquid cooling medium such as water, chilled gases could be used as the cooling medium. The use of a cooling medium, however, is by no means a necessity. For example, cooling member 26 may be a Peltier device. This kind of device does not rely upon a cooling medium to provide cooling, but rather is cooled upon application of electrical energy.

Referring again to FIGS. 1a, 1b, and 1c, bakeplate 20 and cooling member 26 are reciprocally moveable relative to each other so that second major surface 24 of bakeplate 20 and top surface 30 of cooling member 26 can be separated or brought together into thermal contact to controllably carry out baking and/or chilling. To accomplish the most rapid baking of semiconductor device 12, bakeplate 20 and cooling member 26 may be separated by a sufficient distance so that second major surface 24 and top surface 30 are not in thermal contact (see FIG. 1b). When bakeplate 20 and cooling member 26 are separated in this way, virtually little or substantially no cooling effect of cooling member 26 is imparted to bakeplate 20 or semiconductor device 12. To achieve the most rapid cooling of semiconductor device 12, second major surface 24 of bakeplate 20 and top surface 30 of cooling member 26 can be placed into physical contact with each other (see FIG. 1c) while no electrical energy is being supplied to the resistive heating element. Intermediate rates of cooling and/or baking can be accomplished by adjusting the spacing between cooling member 26 and bakeplate 20 and/or by varying the heat output of bakeplate 20. In some instances, a desirable temperature profile for bakeplate 20 can be achieved by maintaining thermal contact between bakeplate 20 and cooling member 26 while both heating and chilling semiconductor device 12 to some degree at the same time. Indeed, simultaneous heating and cooling can be particularly advantageous for maintaining bakeplate 20, and hence wafer 12, at a desired equilibrium temperature (which can be either a baking or chilling equilibrium temperature, as desired) in which the bakeplate equilibrium temperature is controlled to within +/−0.01° C.

Reciprocal relative movement between bakeplate 20 and cooling member 26 may be achieved by using any convenient transport mechanism. According to one representative technique as shown in FIGS. 1a, 1b, and 1c, bakeplate 20 is supported on bakeplate posts 32 which can be raised or lowered to accomplish corresponding independent movement of bakeplate 20. In a preferred embodiment, bakeplate posts 32 are hollow for housing electrical wiring 36 that transports electrical energy to and from an electrically resistive heating element. Advantageously, electrical wiring 36 housed inside hollow bakeplate posts 32 not only is hidden from view for aesthetic purposes, but also is well protected by the walls of bakeplate posts 32. Likewise, cooling member 26 is supported on cooling member posts 34 that can also be raised or lowered in order to achieve corresponding independent movement of cooling member 26. Posts 32 and 34 can also be actuated at the same time to achieve concerted motion of bakeplate 20 and cooling member 26, if desired.

It is understood that during heating or chilling of a workpiece supported by bakeplate 20 over a temperature ramp period, portions of wafer 12 proximal to edge 13 tend to "lead" interior portions of wafer 12. That is, during baking ramps, edges 13 tend to be somewhat hotter than interior portions of wafer 12, and during chilling ramps or at equilibrium, edges 13 tend to be somewhat cooler. To compensate for such temperature edge effects, bakeplate 20 advantageously may incorporate at least two independent heating zones including at least a first inner heating zone underlying at least the area of the bakeplate or heating member associated with the wafer 12, and a second, outer, annular shaped heating zone underlying at least portions of the area of the heating member surrounding the first inner heating zone, and thereby bordering the area covered by the workpiece. The boundary between the two heating zones can preferably approximate the outline of wafer 12.

Such first and second heating zones preferably are independently controllable so that the temperature profile across the diameter of semiconductor device 12 can be made more uniform by independently adjusting the heat output of the inner zone and the outer zone. Thus, if temperature edge effects were to be observed, the relative temperatures of the heating zones could be adjusted to reduce and preferably eliminate such effects. The different heating zones may, if desired, be controlled by separate controllers. Alternatively, the zones may share a common controller that controls the zones so that their respective heat outputs can be controlled in the desired manner.

The wafer-supporting, first major surface 22 of bakeplate 20 can include a plurality of protuberances 56 which help ensure a consistently-sized gap 62 between bakeplate 20 and semiconductor device 12. In accordance with conventional practices, protuberances 56 are of uniform height typically in the range from 10 micrometers to 300 micrometers, preferably 50 micrometers to 200 micrometers. Each individual protuberance 56 typically may have a cross-sectional, workpiece supporting area in the range from 0.01 mm$^2$ to about 6 mm$^2$. Protuberances 56 may be formed with a wide variety of shapes, including, for example, a rectilinear shape with a flat top surface, a cylindrical shape with a flat top surface, a spherical or ellipsoidal shape, a hollow tubular shape in which the axes of the tubes are generally perpendicular to the plane of surface 22 such that only the wall edges of the tubular-shaped protuberances 56 contact semiconductor device 12, combinations of these, or the like.

Protuberances 56 may be formed from any dimensionally stable, durable material that preferably does not scratch wafer 12. For example, protuberances 56 may be formed from any polymer, metal, ceramic, or combination thereof. Ceramics such as alumina, zirconia, or others with low thermal conductivity (e.g., less than 50 w/m°K) are presently preferred. Protuberances 56 can be formed using any suitable technique, including physical placement, etching, sputter deposition, chemical vapor deposition, spraying through an appropriate mask, screenprinting, and the like.

Figure 1D:
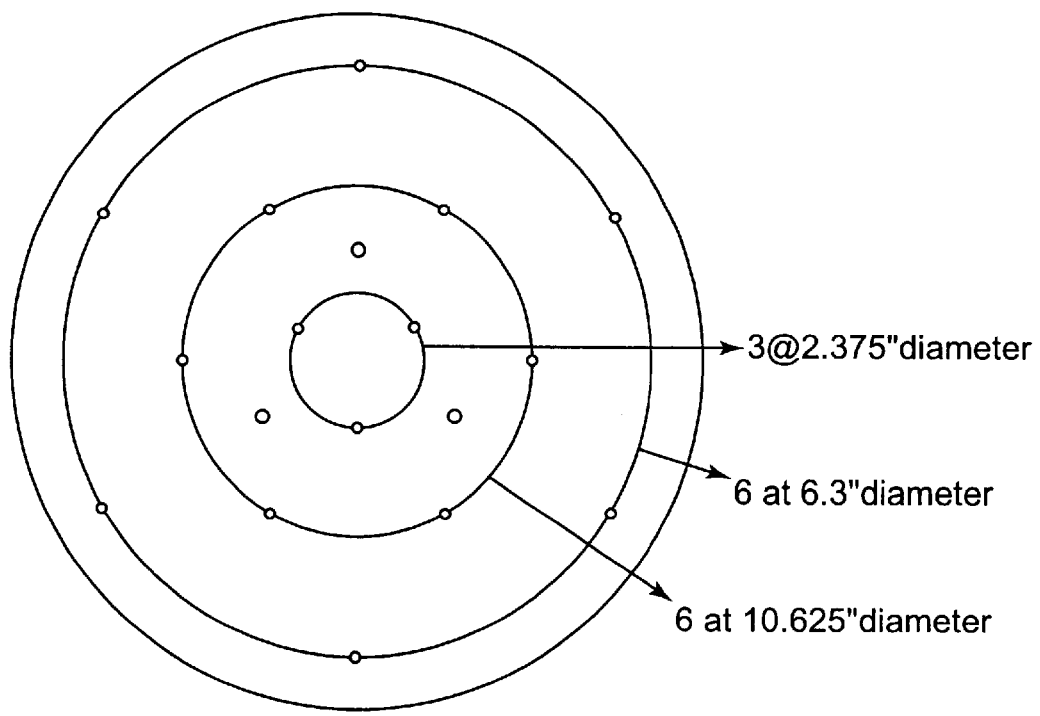
FIG. 1d is a top view of a heating member of the present invention illustrating an arrangement of wafer-supporting protuberances.

Preferably, protuberances 56 are provided with density distribution characteristics effective to provide a contact area between semiconductor device 12 and bakeplate 20 that is 1%, preferably less than 0.1% of the area of first major surface 22 underlying semiconductor device 12. According to one specific example of a protuberance distribution as shown in FIG. 1d, illustrating a bakeplate of a size useful to process a 300 millimeter diameter semiconductor wafer, fifteen tubular protuberances 56 having a height of 150 micrometers, an outside diameter of about 1.6 mm, and an inside diameter of about 0.8 mm, are arranged in three concentric circular patterns positioned at three different radii, e.g., 3 at 2.375" diameter, 6 at 6.3" diameter, and 6 at 10.625" diameter. With this approach, the total contact area between semiconductor device 12 and bakeplate 20 is so small as to be negligible, yet semiconductor device 12 is adequately supported.

Bakeplate 20 may optionally be provided with one or more flow channels 38 to provide fluid communication in gap 62 between bakeplate 20 and semiconductor device 12. Gap 62 may be filled with a gas such as ordinary air or a more conductive gas if it is desired to enhance the thermal conductivity between bakeplate 20 and semiconductor device 12. For example, helium gas is approximately seven times more conductive than air. Introducing a gas into gap 62 might also help reduce the tendency of semiconductor device edge 13 to overheat relative to other portions of semiconductor device 12. Alternatively, in the presence of an appropriate seal between semiconductor device 12 and bakeplate 20, gap 62 may be used to pull a slight vacuum, e.g., a vacuum on the order of 3000 Pa to 14,000 Pa, against wafer 12 in order to help hold wafer 12 in position. On the other hand, by using a heating member having a support surface of precise flatness, the need for vacuum pressure to hold down a workpiece may preferably be eliminated.

Still referring to FIGS. 1a, 1b, and 1c, the temperature of semiconductor device 12 is desirably monitored directly or indirectly during baking and chilling operations so that the heat output of bakeplate 20 can be controlled using a suitable feedback control methodology, such as PID control. According to the direct approach for monitoring wafer temperature, a suitable temperature sensor (not shown) can be attached directly to semiconductor device 12. However, for high volume production applications, this approach is not really practical or desirable.

As an alternative, one or more temperature sensors can be attached to a location at a surface or at an internal location within a heating member. In a preferred embodiment of a heating member, it can be desirable to monitor the temperature of semiconductor device 12 indirectly by incorporating a temperature sensor within bakeplate 20. Under such circumstances, the actual temperature of the top surface of semiconductor device 12 substantially corresponds to or can be correlated to the measured temperature of the bakeplate 20, at substantially all times during baking and/or chilling, even during rapid temperature ramps. Indeed, the difference in temperature between the measured temperature of bakeplate 20 and the top surface of semiconductor device 12 is substantially constant, and more preferably negligible, as a practical matter. Accordingly, when indirectly monitoring the temperature of the top surface of semiconductor device 12 using a temperature sensor incorporated within bakeplate 20, a simple correction, if needed, can be applied to the measured temperature to account for any temperature difference between the top surfaces of semiconductor device 12 and the measured temperature.

The temperature sensor to be used in the present invention may be any suitable temperature sensor capable of sensing temperature at rapid intervals with stability and consistency over long periods of time. A variety of suitable temperature sensing devices are known of which a thin-film embodiment of a resistance temperature detector (RTD) sensor is preferred. Several suitable types are available from a variety of commercial sources. As one example, a suitable thin-film RTD sensor is commercially available under the trade designation 517422 PDX40A from Minco Products, Inc., Minneapolis, Minn. This sensor incorporates a platinum wire having a diameter of about 50 micrometers encased in a "KAPTON" brand polyamide resin layer having a thickness of about 100 micrometers (i.e., the encased wire has an overall diameter of about 250 micrometers). The RTD sensor may be bonded into the heating member at a desired position using a suitable temperature resistant adhesive such as a polyamide resin, a polyimide resin, a polyimideamide resin, a silicone resin, an epoxy resin, microtextured polytetrafluoroethylene, combinations of these, or the like. Preferably, if the RTD is near a layer of the heating member that includes an electrically resistive heating element segment, a ground layer can be located between the RTD and the electrically resistive heating element segment, e.g., a copper ground layer. The ground layer can preferably shield the RTD and reduce the amount of noise otherwise present in the temperature reading signal from the RTD.

As an alternative to buying an RTD temperature sensor, an RTD temperature sensor may be constructed in situ, or constructed in-house and then subsequently bonded into position, from an electroresistive material with RTD characteristics using any suitable formation technique known in the art such as a sputter-etching process. For example, to form an RTD sensor in situ, a layer of a suitable electroresistive metal such as platinum may be deposited at a desired position on a layer of a multi-layer heating element, and then etched to form an RTD temperature sensor. A layer of insulation is desirably deposited between the sensor and the component to which the sensor is attached. The layer of insulation may comprise any insulating material of the type conventionally used in the microelectronics industry, including polytetrafluoroethylene, polyamide, polyimide, polyamideimide, silicon dioxide, silicon nitride, combinations of these, and the like.

Figure 1E:
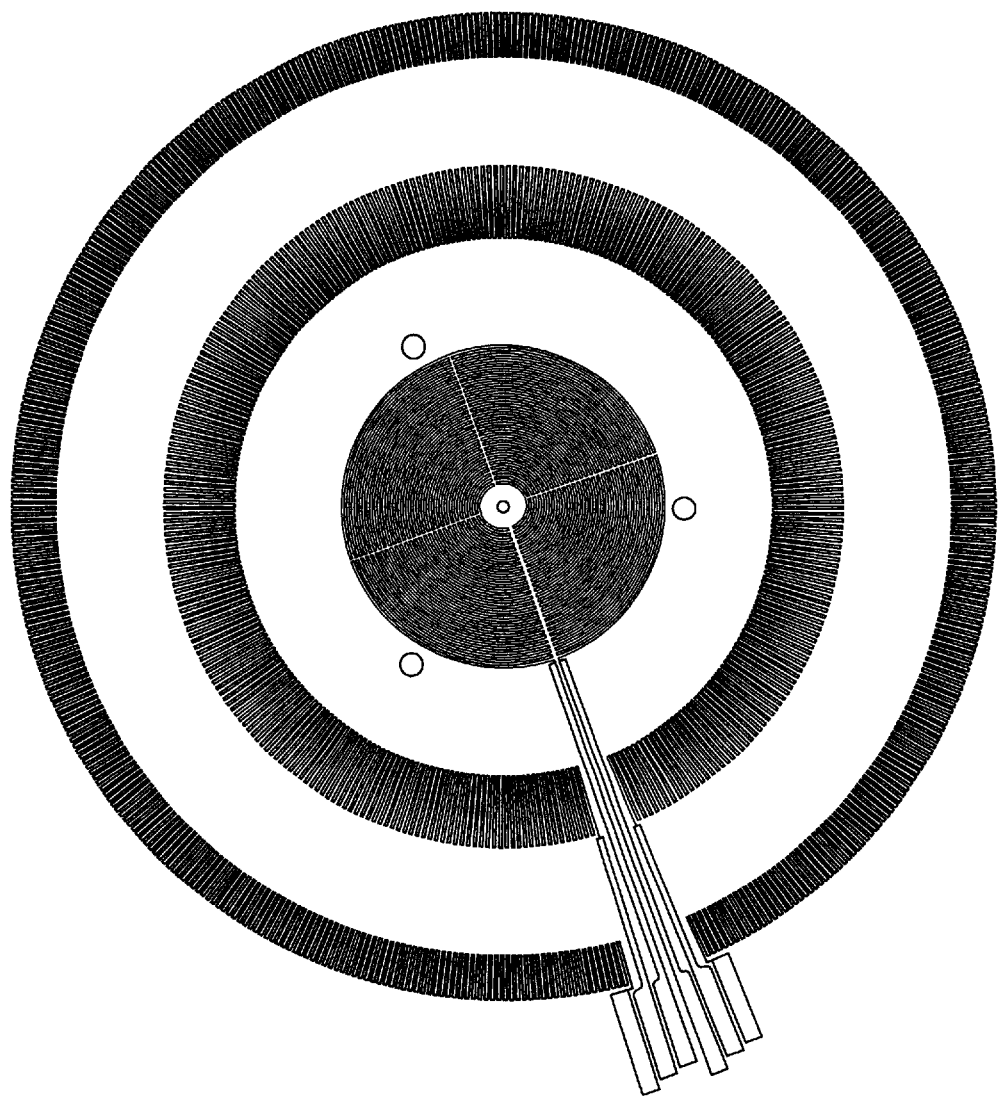
FIG. 1e is a top view of an embodiment of temperature sensors for use in a heating element or a heating member of the invention.

FIG. 1e illustrates a preferred RTD layer that includes at least three separate temperature sensors: one to detect a malfunction and prompt an automatic shut-down; a second to measure temperature of a first region; and a third to measure temperature of a second region.

FIGS. 1a, 1b, and 1c schematically illustrate three configurations of apparatus 10 that are particularly illustrative of how baking and chilling may be carried out. FIG. 1a shows apparatus 10 in a "ready" configuration in which housing 14 is open, allowing semiconductor device 12 to be inserted into apparatus 10 and placed onto stationary support pins 19. Bakeplate 20 is initially in a preferred "idle" position resting atop cooling member 26.

FIG. 1b shows a second configuration of apparatus 10 in which the baking cycle has been initiated by lifting bakeplate 20 free of cooling member 26 to thermally decouple second major surface 24 of bakeplate 20 from cooling member 26. In this configuration, the first major surface 22 of bakeplate 20 is lifted at least flush with support pins 19, or perhaps higher if desired, so that semiconductor device 12 has been brought into thermal contact with first major surface 22 of bakeplate 20. Semiconductor device 12 may be held in place on top of bakeplate 20 using a light vacuum, if desired; as stated previously, due to the improved flatness of a preferred supporting surface a vacuum is not required.

FIG. 1c shows a configuration of apparatus 10 effective to accomplish rapid chilling. In this configuration, cooling member 26 is raised until it is in thermal contact with second major surface 24 of bakeplate 20. Cooling effects of cooling member 26 are now imparted to semiconductor device 12 via conduction through bakeplate 12. The most rapid chilling rates can be achieved by completely turning off heating zone 25 during chilling, but less drastic temperature descents can be achieved by merely adjusting the heat output of heating zone 25. The configuration of FIG. 1c can also be used to achieve relatively slow baking rates by increasing the heat output of heating zone 25 until the chilling effect of cooling member 26 is overcome sufficiently such that the desired baking rate is achieved. Bakeplate 20 and semiconductor device 12 may be thermally decoupled from cooling member 26 when chilling is complete. Thermal decoupling is best accomplished by separating bakeplate 20 and cooling member 26 to achieve the configuration of FIG. 1b. As an alternative, bakeplate 20 and cooling member 26 can remain coupled while a relatively small but sufficient amount of energy is supplied to beater zone 25 to maintain wafer 12 at the desired chill equilibrium temperature.

Figure 2:
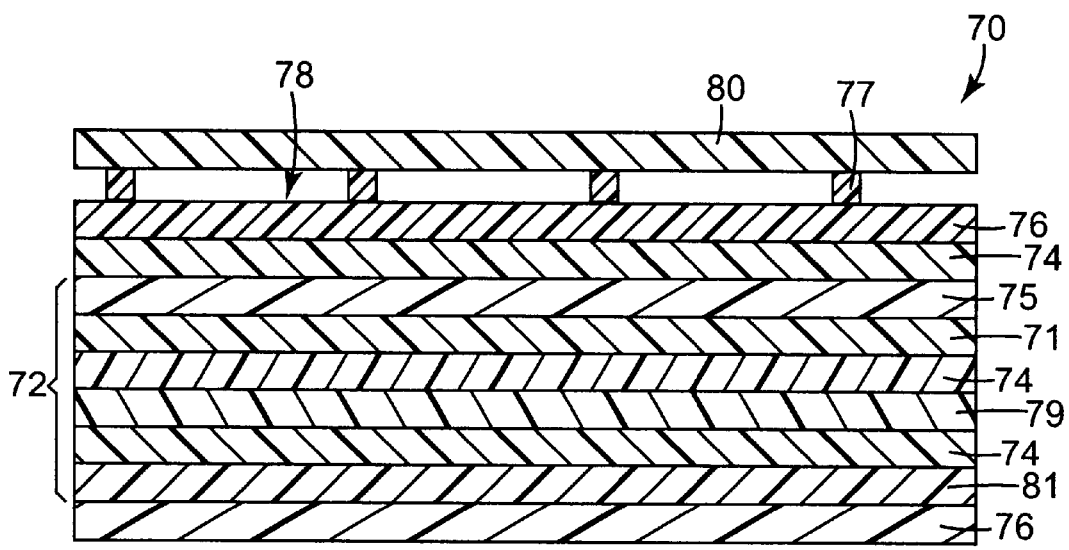
FIG. 2 is a cross sectional view of a heating member embodiment of the invention showing a laminate construction.

An embodiment of a bakeplate 70 of the present invention is shown in FIG. 2. Bakeplate 70 includes centrally positioned multi-layer heating element 72, which comprises, from top to bottom: RTD layer 75, ground layer 71, dielectric layer 74, first heating element layer 79, dielectric layer 74, and second heating element layer 81, all held together by adhesive (not shown). The multi-layer heating element 72 is adhered on one surface to a polyimide layer 74 which is adhered to a thermally conductive layer 76, and the multi-layer heating element 72 is adhered on its other surface (second heater layer 81) directly to second thermally conductive layer 76. Protuberances 77 are provided on supporting surface 78 for supporting wafer 80. Protuberances 77 may correspond to protuberances 56 of FIGS. 1a, 1b, and 1c. In this and other figures, thicknesses of individual laminated layers 72, 74, 76, and 77 making up bakeplate 70 are not drawn to scale and have been exaggerated for purposes of illustration.

In bakeplate 70, each thermally conductive layer 76 can be formed from silicon carbide having a prelapping thickness of about 60 mils, each dielectric layer 74 is formed from polyamide having a thickness of about 50 micrometers, and each of heating element layers 79 and 81 are preferably etched, copper metal or INCONEL, each having a thickness of about 0.008 inches.

Figure 5A:
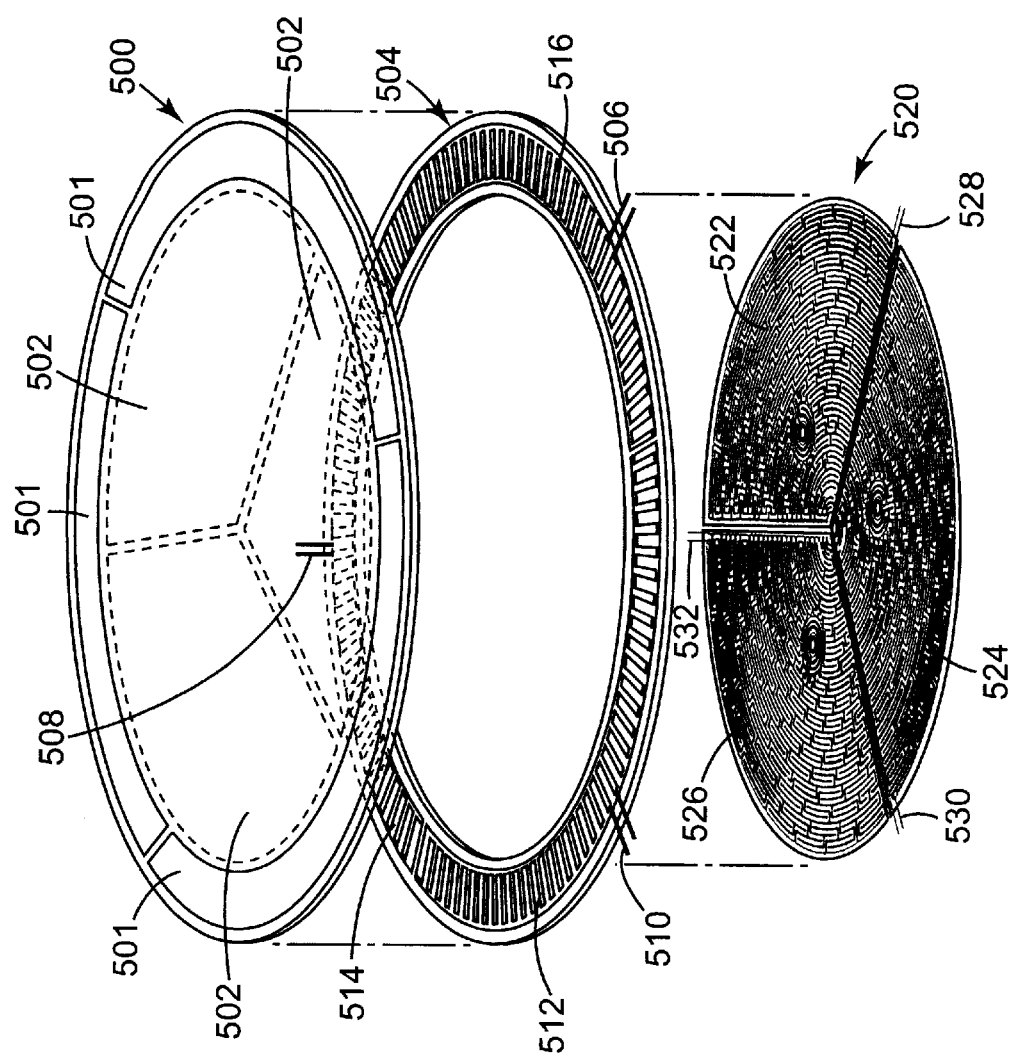
FIG. 5a is an exploded perspective view of multi-layer heating element segments and a thermally conductive layer component of a heating member.

FIG. 5a illustrates an embodiment of a multi-layer heating element. Referring now to FIG. 5a, first heating element layer 504 and second heating element layer 520 include electrically conductive pathways (also referred to as "heating element segments") 512, 514, 516, 522, 524, and 526, which in turn define heating zones (areas of the heating member) 501 (annular) and 502 (circular), respectively. (FIG. 5a shows that each heater zone includes three electrically conductive pathways or heating element segments. This is only exemplary, and each zone may include any number of different heating element segments, from one up to as many as desired or practical, also keeping in mind that the area covered by a heating element segment affects the length and resistance of the segment which in turn affect the options available for the line width, spacing, and composition of the resistive segment, etc.) Electricity is conducted to and from electrically conductive pathways 512, 514, 516, 522, 524, and 526 via electrical connects ("leads") 506, 508, 510, 528, 530, and 532. Electricity conducted along the electrically conductive pathways is converted into thermal energy for heating a wafer (not shown) in an amount that correlates to the voltage of the electrical energy supplied to each segment. Each of electrically conductive pathway traverses a respective heating area with a sufficient pathway density such that each of the heating element layers 504 and 520 is capable of uniformly heating an area or zone of a wafer.

A goal in designing a multi-zone heating element is to achieve a uniform amount of heat per area across the surface of a heating member and uniformity between different segments and between different zones. Normally, the voltage to each heating element segment will be approximately the same. In that case, the heat per area of a segment will depend on the size (width) and density (spacing) of heater lines and the resistance of a heating element material. Based on an equal voltage to each heating element segment, and given the sizes of particular areas covered by each segment, the line thickness, spacing, and material used to produce a heating element segment are chosen to give uniform heat per area over the surface of a heating zone or a heating member. A typical heat output per area can be about 30 watts per square inch.

The size of heating element lines can also be chosen in combination with the thickness of the thermally conductive layer. A thicker thermally conductive layer allows more lateral diffusion of heat through the thickness of the thermally conductive layer, on the way to the surface, so finer lines can be used.

In a general sense, it can be preferred to have 50 to 75% coverage by lines of resistive heating element per total area associated with a heating element segment.

Figure 5B:
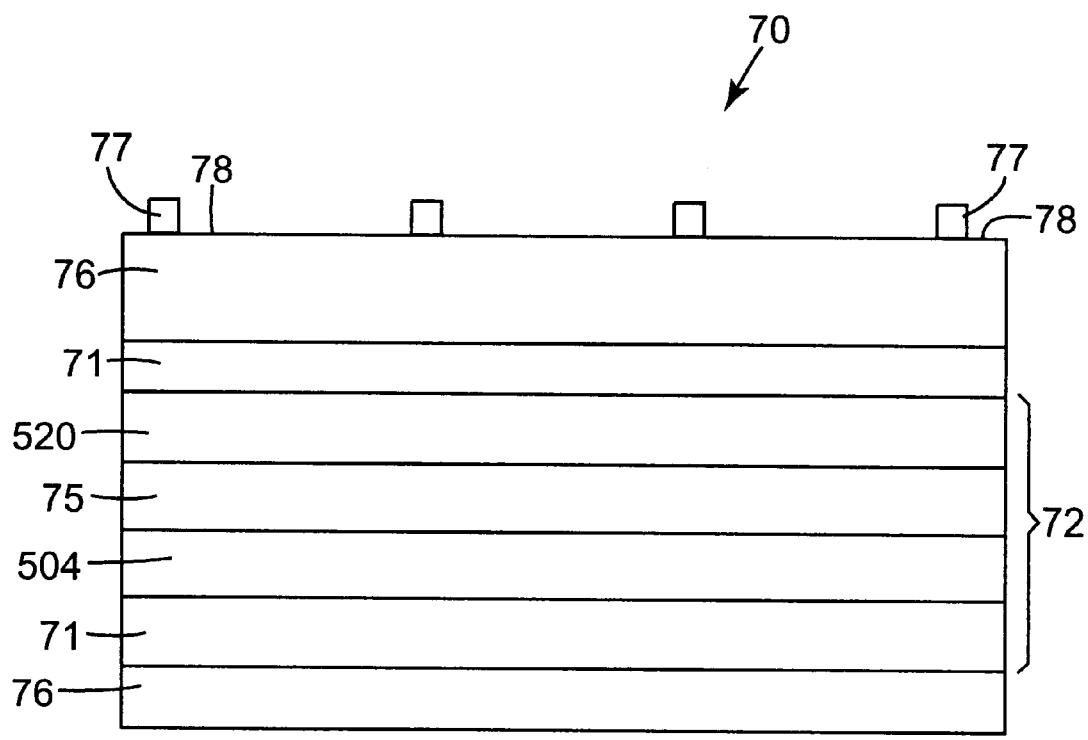
FIG. 5b is a side view of a multi-layer heating element such as that of FIG. 5.
Figure 5C:
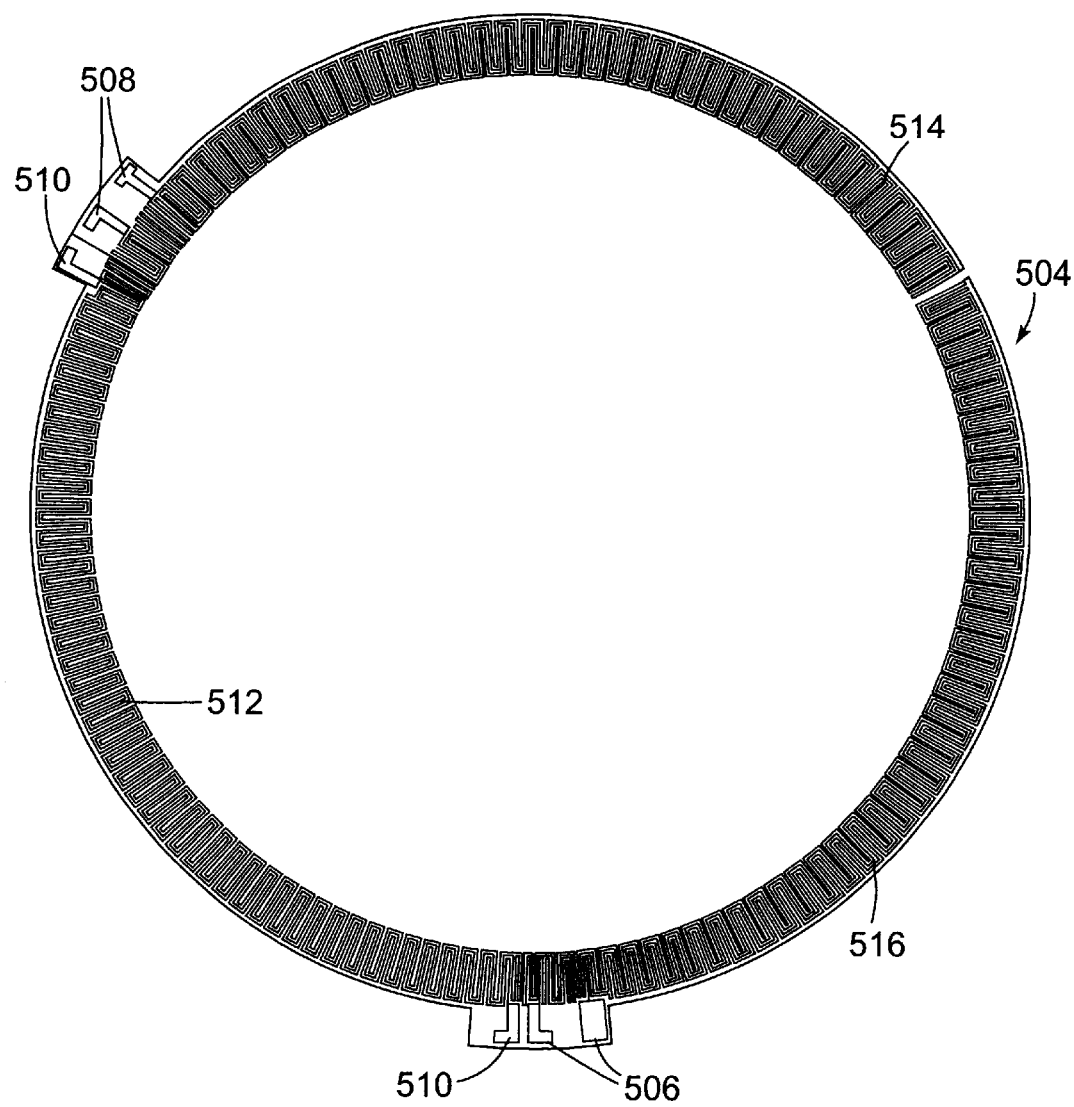
FIG. 5c is a top view of heating element segments of a multi-layer heating element.
Figure 5D:
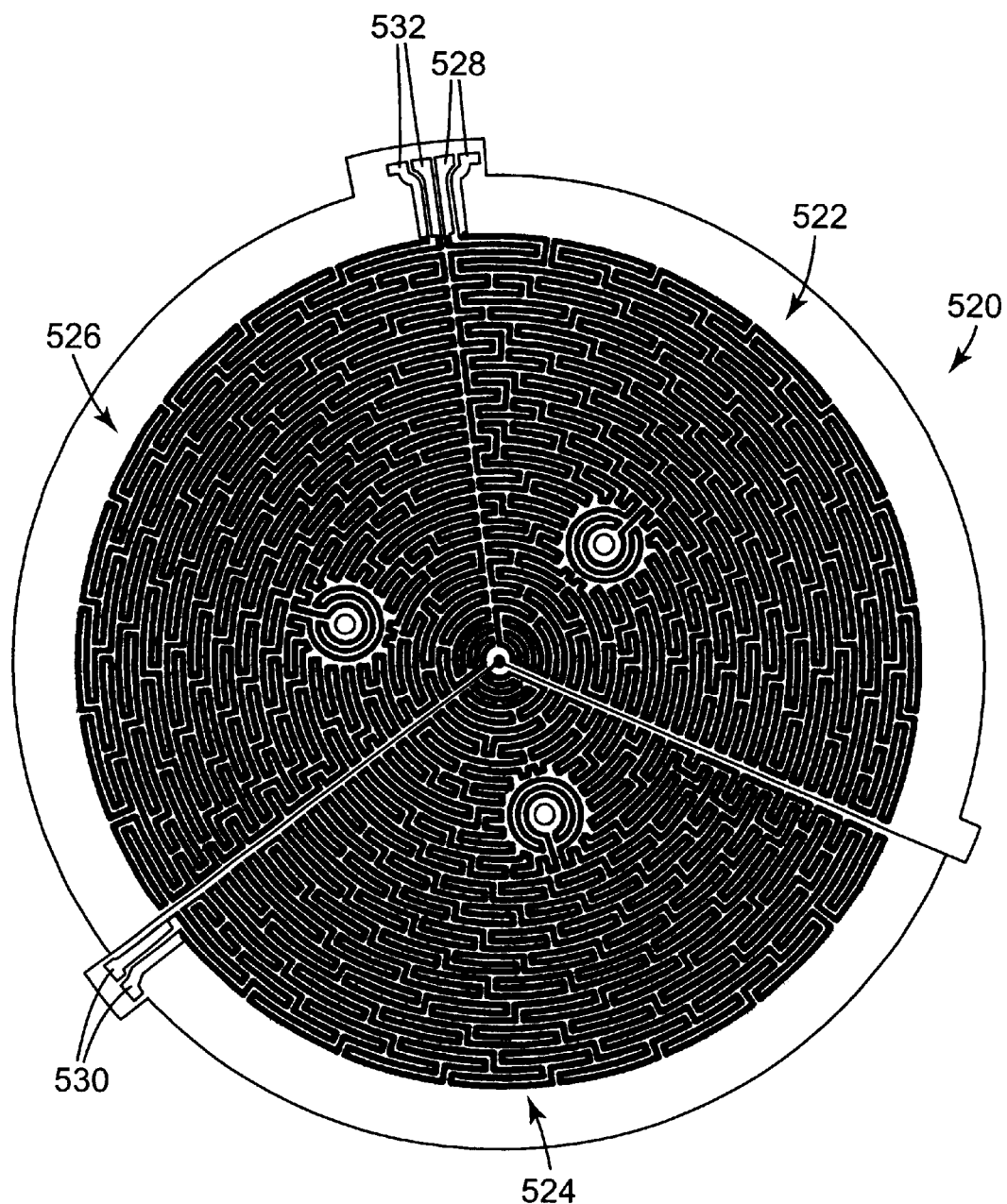
FIG. 5d is a top view of heating element segments of a multi-layer heating element.

In one preferred embodiment of a multi-layer heating element of the invention, a preferred material for the heating element of (3) heating element segments of an inner heating zone (e.g., as shown in FIGS. 5a and 5d) can be CuNi (60 ohms resistance). A preferred material for the three heating element segments of the outer heating zone (e.g., as shown in FIGS. 5a and 5c) can be INCONEL. As can be seen from FIGS. 5c and 5d, outside segments of this preferred embodiment have smaller areas than do inner segments.

In actual practice, the line width of the electrically conductive pathways is typically from about 0.2 mm to 2 mm wide. In the preferred form as shown in FIGS. 5a and 5d, electrically conductive pathways 522, 524, and 526 are in the form of inner pie-shaped segments that collectively define a circle approximating the size of a workpiece typical radius≅300 m or 200 m), surrounded (as shown in FIGS. 5a and 5c) by outer segments 512, 514, and 516 that collective define an annulus. Other configurations can also be used. For example, fewer or more segments can be used, which take the form of full circles or rectilinear forms, if desired.

Referring again to FIG. 5a, this shows an exploded view of a multi-layer heating element adjacent to a thermally conductive layer. Thermally conductive layer 500 is separated into two heating zones: inner, circular zone 502, and outer, annular zone 501. Each zone includes three areas that correspond to three separate heating element segments: three pie-shaped inner segments that define the inner heating zone correspond to three pie-shaped heating element segments of the same area in heating element layer 520, and three partially annular-shaped outer segments that define the annular heating zone correspond to three similarly shaped heating element segments of the same area in heating element layer 504. Not shown in the exploded view of the multi-layer heating element and thermally conductive layer are other components of a heating member, as are discussed elsewhere in this description.

Below and in thermal contact with thermally conductive layer 500 is heating element layer 504. (See also FIG. 5c.) This layer includes one or more heating element segments for heating annular heating zone 501. The example of the figure shows three separate heating element segments 512, 514, and 516, having equal areas. Each heating element segment has attached to it a set of leads to the heating element segment, 506, 508, and 510.

Below and in thermal contact with thermally conductive layer 500 and below heating element 504, is heating element layer 520. (See also FIG. 5d.) This layer includes one or more heating element segments for heating circular heat zone 502. The example of the figure shows three separate heating element segments 522, 524, and 526, having equal areas. Each heating element segment has attached to it a set of leads to the heating element segment, 528, 530, and 532. According to an embodiment of the invention, the leads 528, 530, and 532, of heating element segments 520, 522, and 524 of the heating element layer 520, run adjacent to and below the heating element segments of heating element layer 504.

Heating element segments of a multi-layer heating element can be arranged as shown in FIG. 5a, or can alternatively be arranged with an inner heating zone layer being placed closer to an upper thermally-conductive layer than the outer heating zone layer, as is specifically shown in FIG. 5b. FIG. 5b shows another embodiment of a heating member 70 having an upper surface 78 of a thermally conductive layer 76, with protuberances 77. The layers below, in order and without mentioning adhesives or dielectric layers, are: a ground layer 71 (here, shown to be copper); an inner zone heating element layer 520, e.g., like that of FIG. 5d; an RTD sensor layer; an outer zone heating element layer 504, e.g., like that of FIG. 5c; another ground layer 71 (shown to be copper); and an optional lower thermally conductive layer.

Conductive pathways for heating zones or heating element segments can be formed in a variety of ways. According to one approach, a conductive pathway can be formed from an electrically conductive material that is initially present as a continuous layer. A conductive pathway that correlates to a particular heating zone or heating element segment may be formed by precision etching the continuous layer using any conventional etching technique. Suitable electrically conductive materials include metals such as copper; a Ni—Cr containing alloy such as the Ni—Cr—Co alloy available under the trade designation "INCONEL" from Inco Alloys International, Ltd. of Canada; or the "KOVAR" Ni—Cr—Co alloy available from the Ed Fagan Company, Franklin Lakes, N.J.; platinum; nickel copper (NiCu) alloy; combinations of these; and the like. Electrically conductive heating elements segments that are particularly preferred include those prepared from of CuNi and INCONEL because these materials have very low temperature coefficients of resistance. An electrically conductive heating element segment may have any suitable thickness for accomplishing electrically resistive heating of a type contemplated by this invention. For example, forming heating zone 85 from CuNi/INCONEL heating element segments having a thickness of 0.0008" (0.8 mil), has been found to be suitable.

Referring again primarily to FIG. 2, dielectric layers 74 are included between heater layers 79 and 81, between RTD layer 75 and thermally conductive layer 76, and between ground layer 71 and heater layer 79. The dielectric layers electrically insulate different electrically conductive layers from each other, and also provide separation between rough or textured surfaces of adjacent layers. Dielectric layers 74 also cooperate with the adhesive used to bond the different layers together. Preferably each dielectric layer 74 has a thickness in the range from about 10 micrometers to about 30 micrometers and may be formed from any dielectric material used in the microelectronics industry. Representative examples of suitable dielectric materials include inorganic dielectrics such as silicon dioxide, silicon nitride, mica, and a substantially alkaline-free vitrified porcelain frit; temperature resistant polymers such as polytetrafluoroethylene, polyamide, polyimide, polyamide-imide; any other electrically insulative material that retains electrically insulative characteristics over the temperature ranges associated with baking and chilling; combinations of these; and the like. Preferred dielectric layers 74 are selected to cooperate with a chosen adhesive.

For operations involving temperatures above about 300° C., preferred dielectric layers 74 can include electrically insulative materials such as silicon dioxide, silicon nitride, substantially alkaline-free vitrified porcelain frits, or the like. Polyamide resins are more preferred materials for forming dielectric layers for use in operations occurring at temperatures below about 300° C. Advantageously, polyamide resins not only generally have excellent adhesive and dielectric properties, but are also economical to obtain and easy to incorporate into laminate structures. Polyamide resins also generally tend to be flexible so that bakeplate 70 incorporating such polyamide materials could have conformability characteristics, if desired. A specific example of a polyamide found to be useful in the present invention is available in sheet form as EKJ polyamide thermoset adhesive from E. I. duPont de Nemours & Co.

Figure 3:
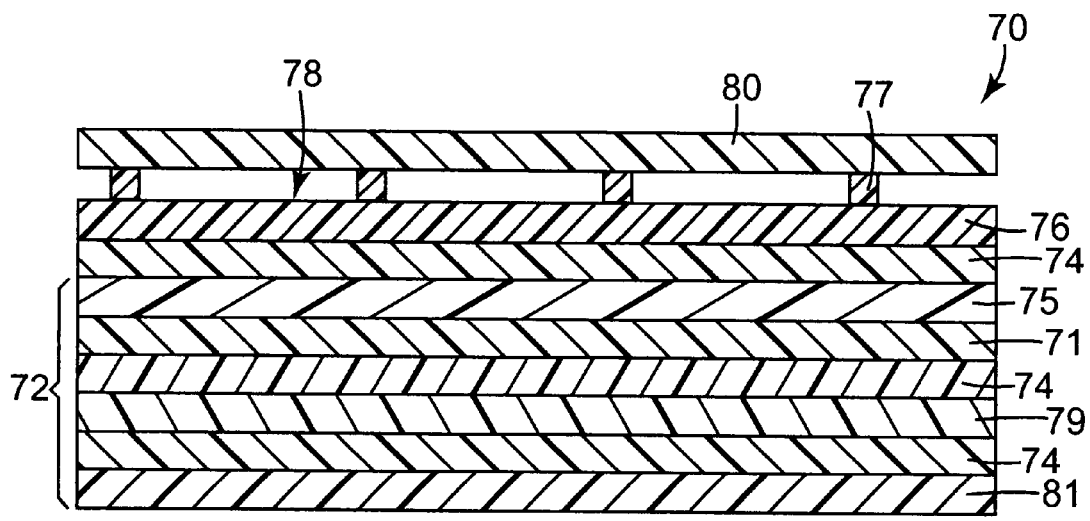
FIG. 3 is a cross sectional view of an alternative embodiment of a bakeplate of the invention showing another laminate construction.

FIG. 3 shows another alternative embodiment of a bakeplate 70 of the present invention. Generally, bakeplate 70 of FIG. 3 is similar to bakeplate 70 of FIG. 2, except that bakeplate 70 of FIG. 3 has only a single thermally conductive layer 76, which is at the top of the bakeplate 70 for supporting a wafer 80, and no second thermally conductive layer is included. Specifically, bakeplate 70 of FIG. 3 is a laminate structure formed from, in order from the bottom, a laminated sequence of layers including a first heater layer 81, dielectric layer 74, second heater layer heater 79, dielectric layer 74, ground layer 71, RTD layer 75, dielectric layer 74, and thermally conductive layer 76 having protuberances 77 on supporting surface 78. Other than the absence of the second thermally conductive layer, another significant difference from the bakeplate of FIG. 2 is that the thickness of the thermally conductive layer 76 of the bakeplate 70 of FIG. 3 is preferably greater so that the single thermally conductive layer provides sufficient structural integrity to the bakeplate 70 in the absence of a second thermally conductive layer. Otherwise, each of the various layers of the bakeplate of FIG. 3 can be similar to or the same as the corresponding layers of FIG. 2. Additional possible advantages of bakeplates having the single thermally conductive layer design of FIG. 3 include a generally simpler construction, the possibility of better heat transfer uniformity, and the possibility of a structurally stiffer and flatter heating member.

Figure 4:
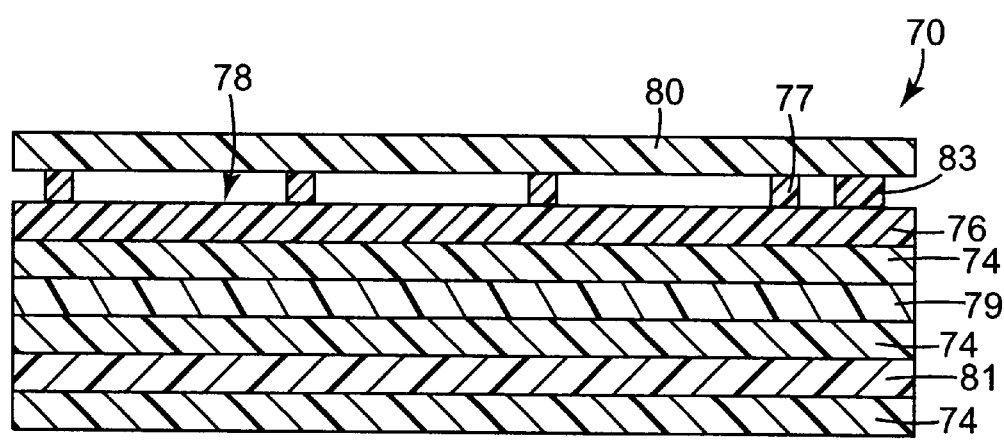
FIG. 4 is a cross sectional view of an alternative embodiment of a bakeplate of the invention showing another laminate construction.

FIG. 4 shows yet another alternative embodiment of a bakeplate 70 of the present invention. Generally, bakeplate 70 of FIG. 4 is similar to bakeplate 70 of FIG. 2a, except that bakeplate 70 of FIG. 4 does not include an RTD layer 75 or a ground layer 71. As a replacement to the RTD layer, bakeplate 70 of FIG. 4 uses a temperature sensor placed at a surface of the heating member; FIG. 4 shows temperature sensor 83 adhesively attached to the top surface of the heating member. Temperature sensor 83 can be any suitable temperature sensor. Consequently, bakeplate 70 of FIG. 4 is a laminate structure formed from, in order, a laminated sequence of layers including a dielectric layer 74, heating element layer 81, dielectric layer 74, heating element layer heater 79, dielectric layer 74, and thermally conductive layer 76 having on a supporting surface 78, protuberances 77, and temperature sensor 83 adhesively bonded to surface 78 of thermally conductive layer 76. Other than the absence of the ground layer 71 and RTD layer 75, and a second thermally conductive layer 76 (which is not shown but may optionally be included) each of the various layers of the bakeplate of FIG. 4 is analogous to or the same as the corresponding layers of the bakeplate 70 of either FIG. 2 or FIG. 3.

Of course other modifications and changes in the materials or order of the layers of the bakeplate 70 can also be made. For instance more or fewer heating layers may be included, as desired, or one or more dielectric layers may be eliminated.

Figure 6:
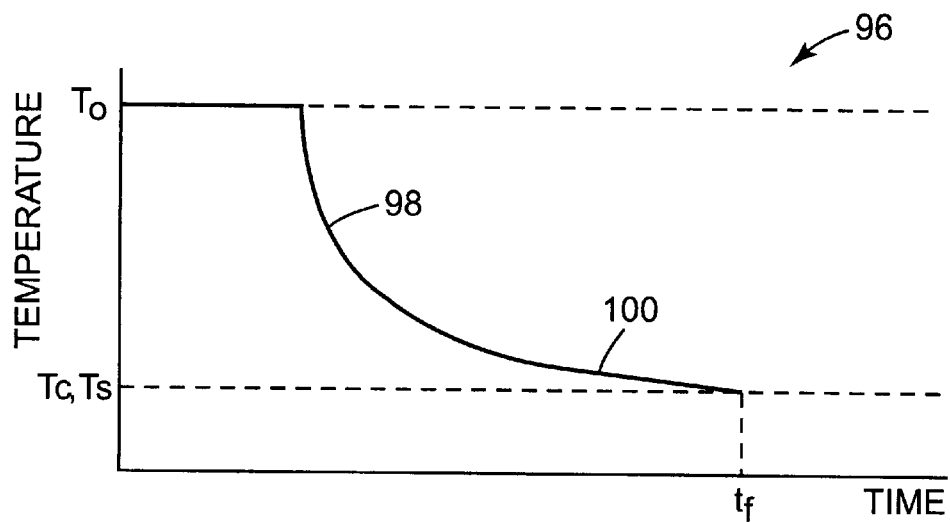
FIG. 6 is a temperature profile of a semiconductor device that is being chilled with a chill plate that is maintained at the same temperature as the desired final chill dwell temperature.
Figure 7:
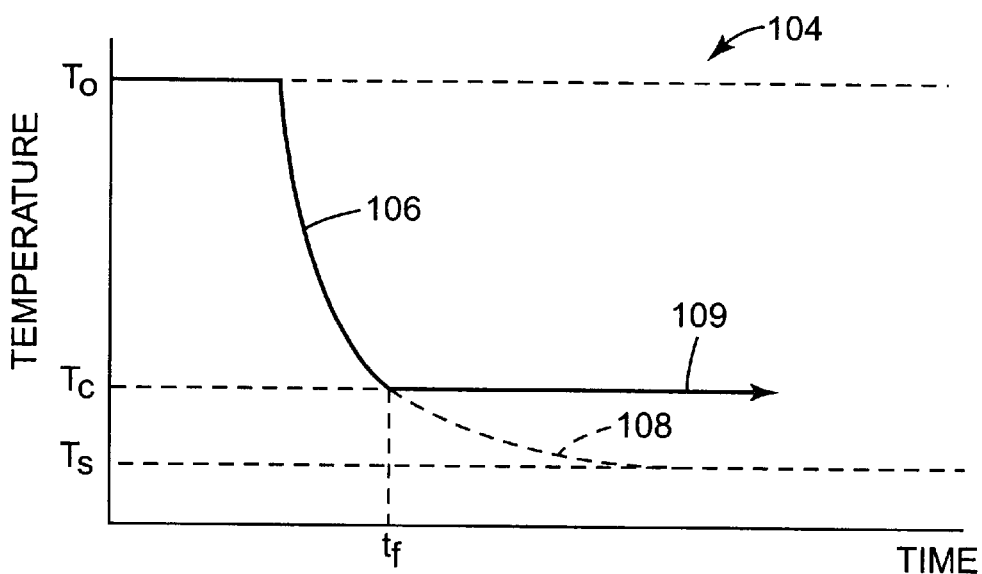
FIG. 7 is a temperature profile of a semiconductor device that is being chilled with a chill plate that is maintained at a temperature below the final desired chill equilibrium temperature.

The chilling characteristics of apparatus 10 illustrated in FIGS. 1a, 1b, and 1c will now be further explained with respect to the temperature profiles of FIGS. 6 and 7. In one approach to cooling a workpiece, cooling member 26 may be maintained at a temperature, $T_c$, to which semiconductor device 12 is to be cooled. FIG. 6 shows a temperature profile 96 of a typical semiconductor device 12 during chilling when using such an approach. Initially, semiconductor device 12 is at an initial temperature $T_o$ and then asymptotically approaches and substantially reaches the final temperature $T_c$ after a time $t_f$. As illustrated in FIG. 6, this conventional approach results in rapid initial chilling of semiconductor device 12 in region 98 when the difference between the semiconductor device temperature and $T_s$ is relatively large. However, as shown by region 100, the chill rate slows down exponentially as the device temperature approaches $T_c$. In fact, with the approach shown in FIG. 6, over 50% of the chill time can be spent in getting the last 2% to 3% of heat out of semiconductor device 12.

Of course, the chilling approach of FIG. 6 may be used in the practice of the present invention if desired. However, to avoid the inefficiencies of the FIG. 6 approach, the present invention preferably uses a more preferred "chill boost" method of chilling semiconductor device 12. According to the chill boost approach, shown in FIG. 7, cooling member 26 is maintained at a temperature $T_s$ less than $T_c$, and the device temperature is dynamically monitored during chilling so that chilling can be stopped when device 12 is chilled to $T_c$. FIG. 7 shows a temperature profile 104 of semiconductor device 12 as it is cooled from an initial, relatively hot temperature $T_o$ down to the desired final temperature of $T_c$. The set point temperature $T_s$ of cooling member 26, however, is desirably maintained at a temperature below $T_c$. This allows semiconductor device 12 to be chilled to $T_c$ in a manner such that substantially all of the chilling can be accomplished in accordance with the rapid cooling rate associated with region 106. Thus, the asymptotic and very slow rate of chilling associated with region 108 is entirely avoided. Generally, it has been found that setting $T_s$ at a temperature approximately 2° C. to 3° C. below $T_c$ has been suitable for achieving a desirable amount of chill boost. The chill boost approach is an extremely rapid and accurate method for accomplishing chilling. The chill boost method allows chilling to be completed as much as three times faster than using the conventional approach lacking a chill boost, mainly because the exponential, very slow rate of chilling associated with region 108 is entirely avoided.

Once device 12 is cooled to Tc, it is often desirable to maintain device 12 at equilibrium at Tc for a certain period of time as represented by profile region 109. This is easily accomplished using apparatus 10 of FIGS. 1a, 1b, and 1c. Quite simply, to initiate chilling, bakeplate 20 is turned off and brought into thermal contact with cooling member 26 as shown in FIG. 1c. Device 12 is chilled as a result, and the device temperature begins to drop towards Tc. When device 12 reaches Tc, the configuration of FIG. 1c is maintained while bakeplate 20 is turned back on with just enough power to maintain wafer 12 at Tc. A suitable process control methodology can be used to control the heat output of bakeplate 20 to maintain device 12 at the desired equilibrium temperature Tc.

The ability to use the heat output of bakeplate 20 and the cooling effects of cooling member 26 in combination to maintain equilibrium temperatures and/or to control temperature profiles provides many significant advantages. First, equilibrium temperatures can be maintained with an extremely high level of accuracy over long periods of time. For example, this approach is precise and may be used to maintain wafer 12 at Tc with an accuracy of about +/−0.03° C., particularly when implemented with a preferred process control system based on pulsed width modulation, proportional/integral/derivative (PID) control techniques, with a digital signal processor (DSP). Second, such a control approach is very responsive because the heat from bakeplate 20 can be used to stop further chilling quite quickly. Third, the temperature of cooling member 26 does not need to be controlled very closely. As long as cooling member 26 is at a temperature below Tc, extremely accurate control of the temperature of the workpiece can be achieved by controlling the heat output of bakeplate 20. Fourth, because it is not necessary to control the temperature of cooling member 26 very closely, mechanisms ordinarily relied on to supply cooling media to cooling member 26 at precise temperatures can be eliminated.

As an alternative way to stop chilling when it is not desired to maintain wafer 12 at Tc for any length of time once Tc is reached, chilling can be stopped merely by separating bakeplate 20 from cooling member 26 at the appropriate time. When using this approach, it may be advantageous to be able to predict the point (the "chill end point") in the chilling process at which a control signal for halting the chilling process should be generated. This ensures that device 12 is cooled as closely as possible to the final chill temperature, Tc. In practice, such prediction preferably should take into account the finite amount of lag time needed for apparatus 10 to respond to such a signal once such a signal is generated.

For example, with respect to apparatus 10 illustrated in FIGS. 1a, 1b, and 1c, it may take a small, but non-negligible amount of time to physically separate bakeplate 20 from cooling member 26 following the time that a control signal to halt chilling is initially generated. Therefore, in anticipation of such a lag time, the control signal for halting the chilling process should be transmitted to apparatus 10 slightly in advance of the time at which semiconductor device 12 actually reaches the final chill temperature, Tc. As a specific example, with a lag time of about 500 milliseconds, a separation signal may be sent out 500 milliseconds (for example) before semiconductor device 12 is predicted to be at Tc.

Determining the appropriate chill end point, with the lag time in mind, can be accomplished using any suitable open-loop or closed-loop process control technique. For example, a suitable control system, e.g., a control system using PID techniques, can be used to dynamically determine the chill end point at which a control signal should be sent to apparatus 10 to stop chilling at the proper time. Alternatively, one could characterize the parameters (e.g., wafer temperature, elapsed chilling time, lag time, etc.) associated with the chill end point, and then such parameters could be monitored to stop chilling in time.

Figure 8:
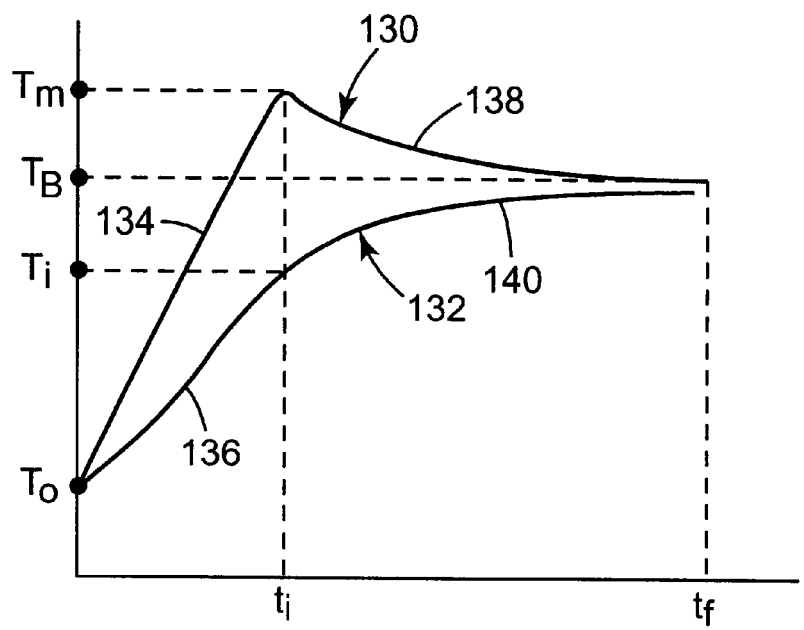
FIG. 8 is a temperature profile of a semiconductor device being heated to an equilibrium temperature without a chill boost.
Figure 9:
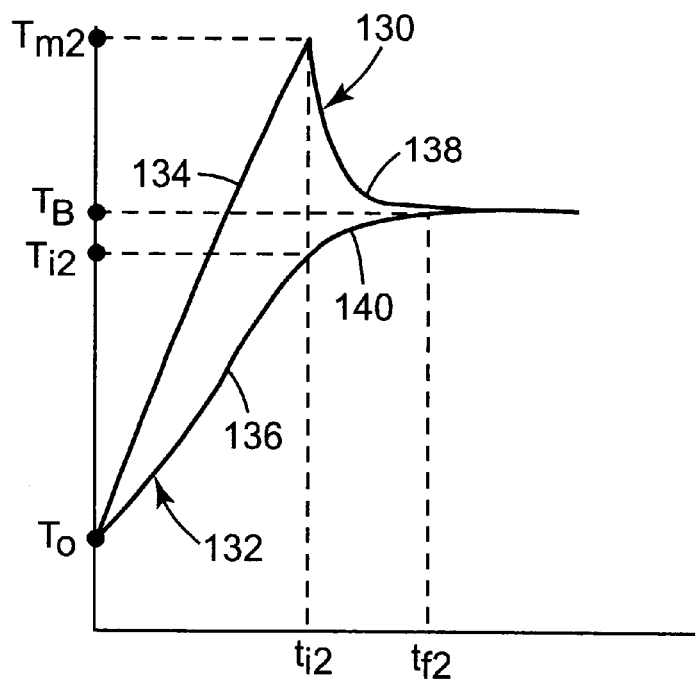
FIG. 9 is a temperature profile of a semiconductor device being heated to an equilibrium temperature with a chill boost.

The baking characteristics of apparatus 10 illustrated in FIGS. 1a, 1b, and 1c will now be further described with respect to FIGS. 8 and 9. FIG. 8 shows typical temperature profiles 130 and 132 of bakeplate 20 and semiconductor device 12, respectively, for a baking operation in which device 12 is heated from a temperature $T_o$ (e.g., room temperature) up to a temperature $T_B$ (e.g., 130° C.) over a period $t_f$. During such heating, bakeplate temperature profile 130 generally leads device temperature profile 132. That is, bakeplate 20 tends to be somewhat hotter than device 12 at all times during heating, until bakeplate 20 and device 12 reach an equilibrium temperature substantially corresponding to $T_B$, preferably within +/−0.03° C. of $T_B$. The temperature of bakeplate 20, therefore, must be allowed to overshoot $T_B$ to make sure that device 12 reaches $T_B$. At some point in the heating process, therefore, the heat output of bakeplate 20 is reduced to allow device 12 and bakeplate 20 to asymptotically approach and substantially reach $T_B$. This typically occurs after a time $t_i$ when bakeplate 20 is at a maximum temperature $T_m$ above $T_B$ but while device 12 is at a temperature $T_i$ below $T_B$. The precise time $t_i$ at which the heat output of bakeplate 20 is reduced depends upon the time constant of the system, and is a typical output of a conventional PID controller.

The heating approach of FIG. 8 results in a relatively rapid heating rate in profile regions 134 and 136 before the heat output of bakeplate 20 is reduced. However, the heating rate slows exponentially in profile regions 138 and 140 once bakeplate 20 is powered down at time $t_i$. In fact, at least about 70% of the time required to heat device 12 from $T_o$ to $T_B$ involves asymptotically heating device 12 from $T_i$ to $T_B$, even though the temperature difference between $T_B$ and $T_i$ is generally a small fraction of the total temperature range extending from $T_o$ to $T_B$. In other words, a substantial amount of heating time is spent adding the last few degrees of heat to device 12. Much heating time is invested to achieve a moderate change in temperature needed to get device 12 up to $T_B$.

Of course, the heating approach of FIG. 8 may be used with beneficial results in the practice of the present invention, if desired. Indeed, the approach of FIG. 8 allows device 12 to be heated from $T_o$ to $T_B$ as rapidly as 40 to 50 seconds. However, the time inefficiencies associated with profile regions 138 and 140 can be substantially reduced by using a "chill boost" from cooling member 26. Generally, according to the "chill boost" approach for baking, bakeplate 20 is allowed to reach a temperature higher than even $T_m$ to allow device 12 to be heated up to a temperature much closer to $T_B$ before powering down bakeplate 20. Cooling member 26 is then used to rapidly draw excess heat from bakeplate 20 to help ensure that the temperature of device 12 substantially reaches but does not overshoot $T_B$.

The benefits of the "chill boost" method of heating are illustrated in FIG. 9. FIG. 9 is generally identical to FIG. 8, except that bakeplate 20 reaches a higher maximum temperature $T_{m2}$ (as compared to $T_m$) and device 12 reaches a higher temperature $T_{i2}$ (as compared to $T_i$) when the heat output of bakeplate 20 is reduced at time $t_{i2}$. In the absence of corrective action, and if the heating scheme of FIG. 8 were to be used at this point without a chill boost, the excess heat in both bakeplate 20 and device 12 would ordinarily cause the temperature of device 12 to overshoot $T_B$. That is, bakeplate 20 and device 12 would asymptotically approach some equilibrium temperature above $T_B$. However, in this instance, cooling member 26 is brought into thermal contact with bakeplate 20 under conditions effective to ensure that the excess heat is drawn into cooling member 26. As a consequence, bakeplate 20 and device 12 substantially reach $T_B$ at a time $t_{f2}$ substantially less than time $t_f$. While the temperature of device 12 will still tend to asymptotically approach $T_B$ after bakeplate 20 is powered down, the time period associated with such asymptotic heating is substantially reduced relative to that associated with FIG. 8. For example, although the heating method of FIG. 8 might take 40 to 50 seconds to complete, this time would be reduced to about 25 to 35 seconds using the "chill boost" approach of FIG. 9.

The bakeplate preferably uses a heater control approach that provides rapid and precise control over the temperature of the heating member. A preferred heating control system for use with the heating member of the invention is of the type generally described in U.S. Pat. No. 6,072,163, which uses a high frequency (e.g., preferably a frequency above 1000 Hz) pulse width modulated control signal to modulate DC electrical energy supplied to heating element segments incorporated into an RLC (resistance/inductor/capacitor) circuit in which a single resistive heating element or multiple resistive heating element segments are the resistance, and the inductor and capacitor help smooth the DC voltage across the heating element. With this approach, the amount of voltage controllably established across a heating element may be rapidly and continuously varied within a power range from 0 to 100%. In practical effect, the DC electrical voltage developed across a heating element has practically infinitely small granularity. This allows the temperatures of a heating element to be controlled with agility and precision over a wide dynamic range.

Accordingly, in one preferred embodiment of a temperature control system for use with the heating member, DC power is modulated using a high frequency PWM control signal to control the amount of heat from one or more heating element segments in a heating element of the heating member. As an overview, a controller develops a high frequency, pulse width modulated control signal in response to a temperature signal generated by the temperature sensor, e.g., an RTD temperature sensor as shown above. The PWM control signal is used to operate a switch for turning on the portion of the duty cycle of each pulse of the control signal. This establishes a corresponding voltage across a resistive heating element that is proportional to the duty cycle of the PWM control signal. The power output of the heating element is then proportional to the square of such voltage.

For example, if the DC power is supplied at 300 volts, a 20,000 Hz PWM control signal having a duty cycle of 10% will establish 30 volts (10% of 300 volts) across a resistive heating element, and a corresponding 1% heat output. If the DC power is supplied at 300 volts, a 20,000 Hz PWM control signal having a duty cycle of 60% will establish 180 volts (60% of 300 volts) across a resistive heating element and a 36% heat output. Similarly, if the DC power is supplied at 300 volts, a 20,000 Hz PWM control signal having a duty cycle of 5% will establish 15 volts (5% of 300 volts) across a resistive heating element, and hence a 0.25% heat output.

The temperature sensor from the heating member transmits information comprising a temperature signal to a controller. The controller desirably includes a conventional driver circuit and noise filter to process the temperature data acquired from the temperature sensor before the data reaches the controller. The driver circuit is used to adjust the amplitude of a detected temperature signal, if desired, and/or to convert the detected data into an alternate form more suitable for further processing. A noise filter can be used to reduce the noise content, i.e., increases the signal to noise ratio, of a temperature sensor signal to enhance its processability by the controller.

The controller may be comprised of any combination of hardware, software, and the like, effective to enable that controller to generate a PWM control signal from the temperature sensor input. In generating the PWM output from such information, any suitable process control methodology and componentry may be used, although techniques of proportional/integral/derivative (PID) control are preferred. PID control, and principles of process control generally, are described in Coughanowr and Koppel, *Process Systems Analysis and Control*, McGraw-Hill Book Company (1965); and F. G. Shinskey, *Process Control Systems* (1988).

The controller may be formed from hardware, software, or combinations thereof, and may be digital and/or analog. A variety of systems suitable for use as a controller are commercially available, and these may be purchased and incorporated into a temperature control system in plug-and-play fashion. For example, in one embodiment, a PC-based control and analysis system commercially available under the trade designation "LABVIEW" from National Instruments, Austin, Tex. may be used. Alternatively, and more preferably, a controller may be in the form of an embedded controller incorporating one or more microprocessors and/or digital signal processors (DSPs). DSPs are fast, reliable, and inexpensive. DSPs are described, for example, in Curran, L., Machine Design, "DSPs Find a Place in Motor Control", pages 95–102 (Nov. 6, 1997). Representative examples of suitable DSP device sets are commercially available from Analog Devices, Inc. and include (i) the AD7715 (16 bit sigma delta ADC) device or the AD7711 (signal conditioning ADC with RTD excitation current) device, and (ii) the ADSP-2100 (digital processor) device.

As indicated above, a preferred embodiment of the heating member can include multiple heating zones, each corresponding to one or more heating element segments of the heating element. This feature can preferably be incorporated into the temperature control system with calibration of the different resistive heating element segments to the temperature control system and the heating member. Specifically, it can be preferred to calibrate the heating member by placing a desired workpiece in position on the heating member, and heating or chilling. Next, a temperature profile of the workpiece is performed, and the heating control system is adjusted to provide the most uniform temperature profile. This flexibility can compensate for minute differences in the thermal properties of the heating member.

FIGS. 10–13 illustrate a particularly preferred embodiment of a bake/chill apparatus 400 of the present invention. Apparatus 400, for purposes of discussion, is an embodiment of the present invention suitable for processing a workpiece in the form of wafer 540. As an overview, apparatus 400 includes various subassemblies for carrying out baking and chilling operations. These subassemblies can include lid assembly 401, bakeplate assembly 403, cooling member assembly 404, and a drive train assembly. These assemblies are supported over and/or mounted to a main base. The drive train assembly includes components that cause upward and downward movement of the bakeplate and cooling member to place apparatus 400 into one of three operational configurations including a loading/unloading configuration, a chilling configuration, and a baking configuration.

Figure 11:
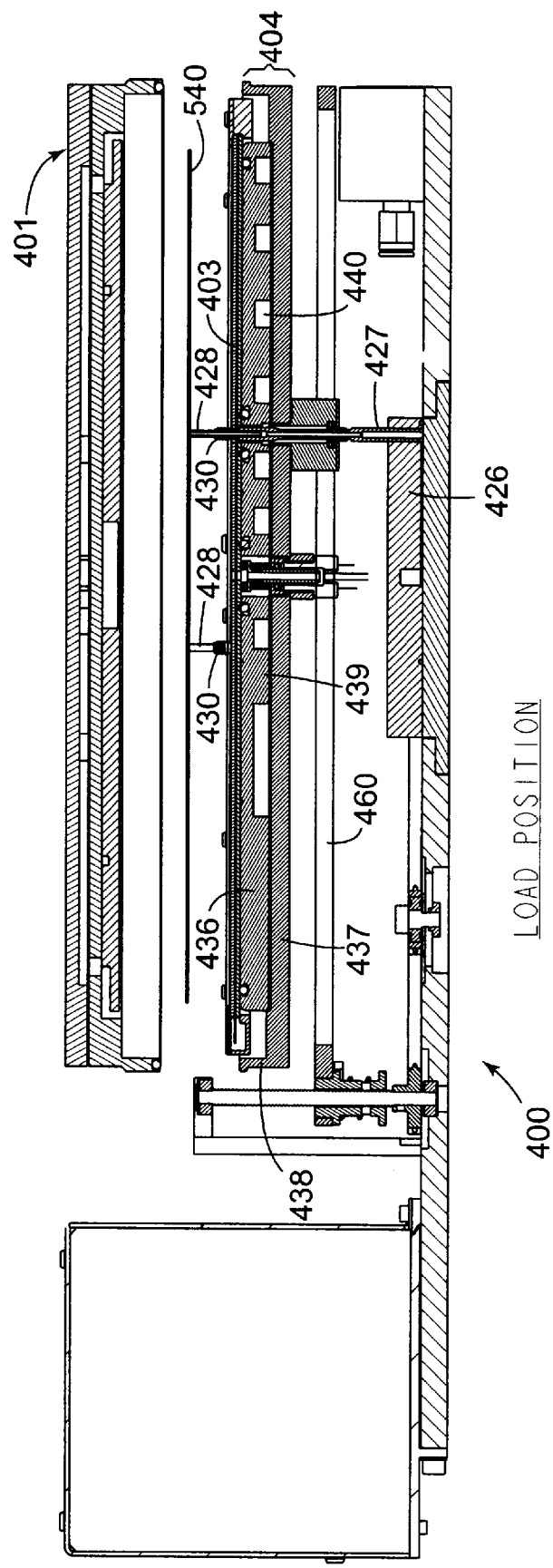
FIG. 11 is a cross-sectional side view of the bake/chill station of FIG. 10.
Figure 11A:
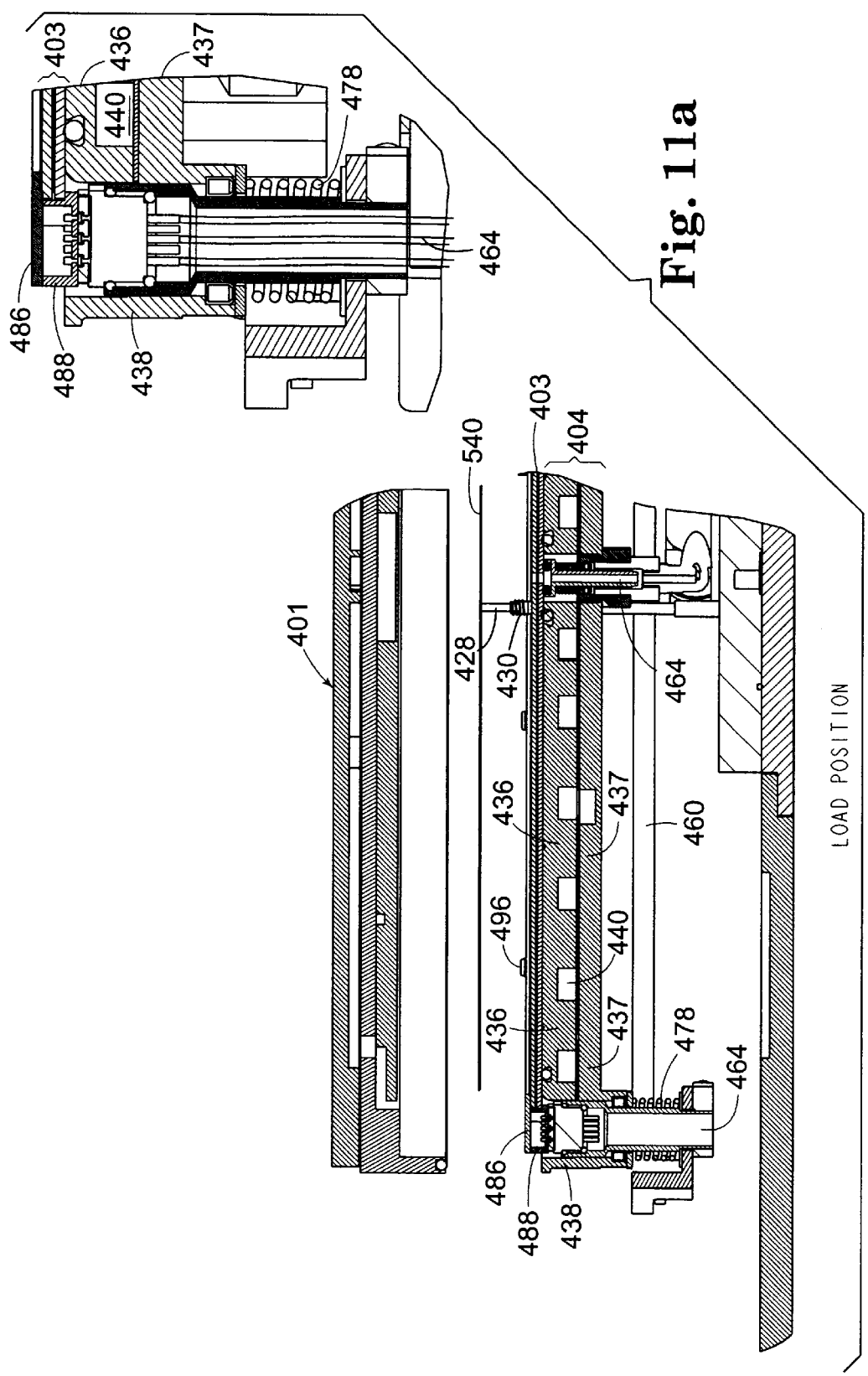
FIG. 11a is a cross-sectional side view of the bake/chill station of FIG. 10.

Referring now primarily to FIGS. 11 and 11a, lid assembly 401 includes a stacked assembly of essentially ring-shaped side wall members and a top panel. These stacked components define lid assembly 401 adapted to receive portions of a heater assembly during baking and chilling operations.

Figure 10:
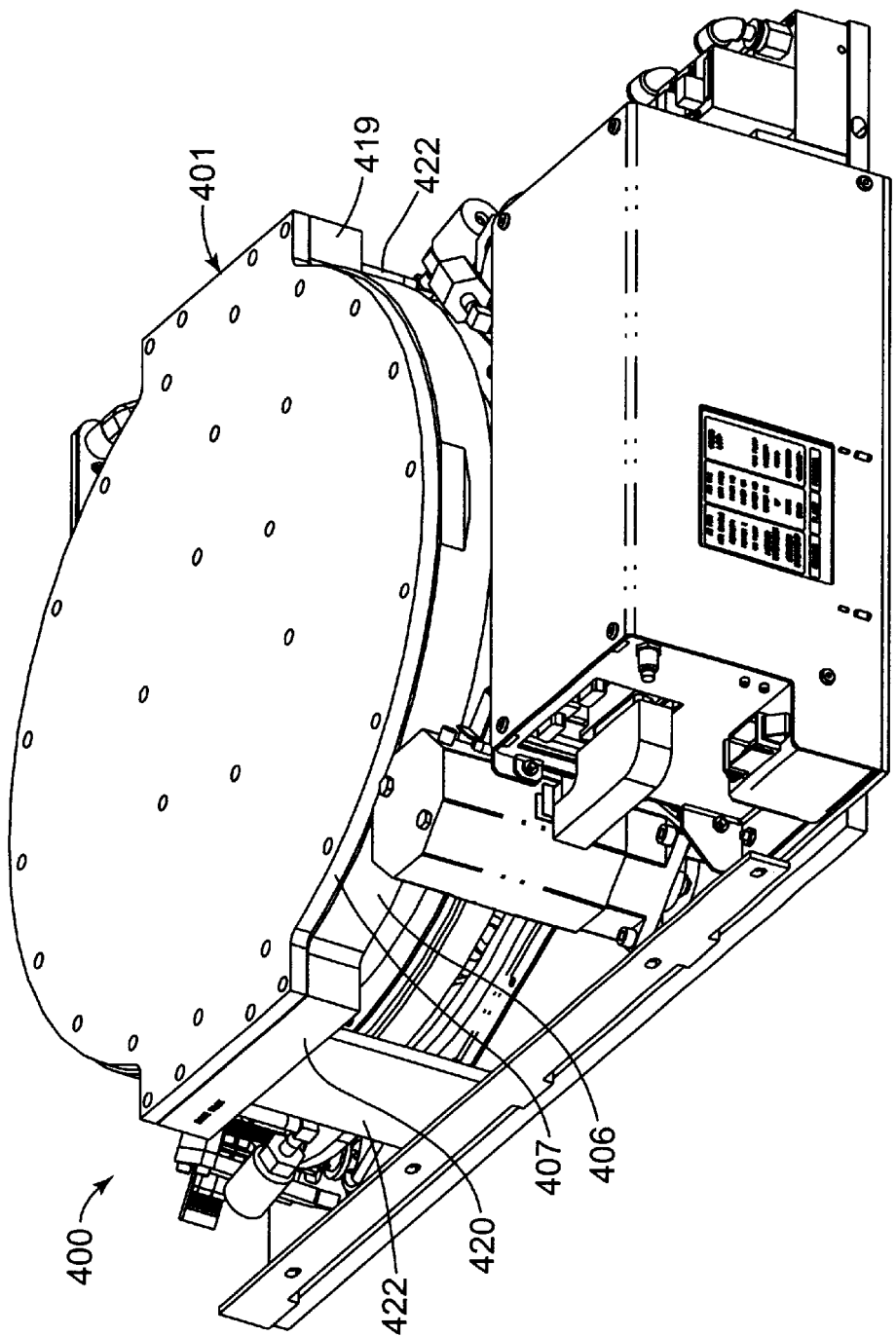
FIG. 10 is a perspective view of a bake/chill station.

Lid assembly 401 is supported by lid support posts 422 in a stationary manner, and, consequently, lid assembly 401 does not move during baking and chilling operations (see FIG. 10). Each lid post 422 is attached to a corresponding shoulder 419 or 420. Unless noted otherwise herein, the components of lid assembly 401 and posts 422 preferably are formed of stainless steel although other materials such as aluminum, high temperature plastics such as polyamide, polyimide, polyamideimide, and the like, can be used.

Figure 12:
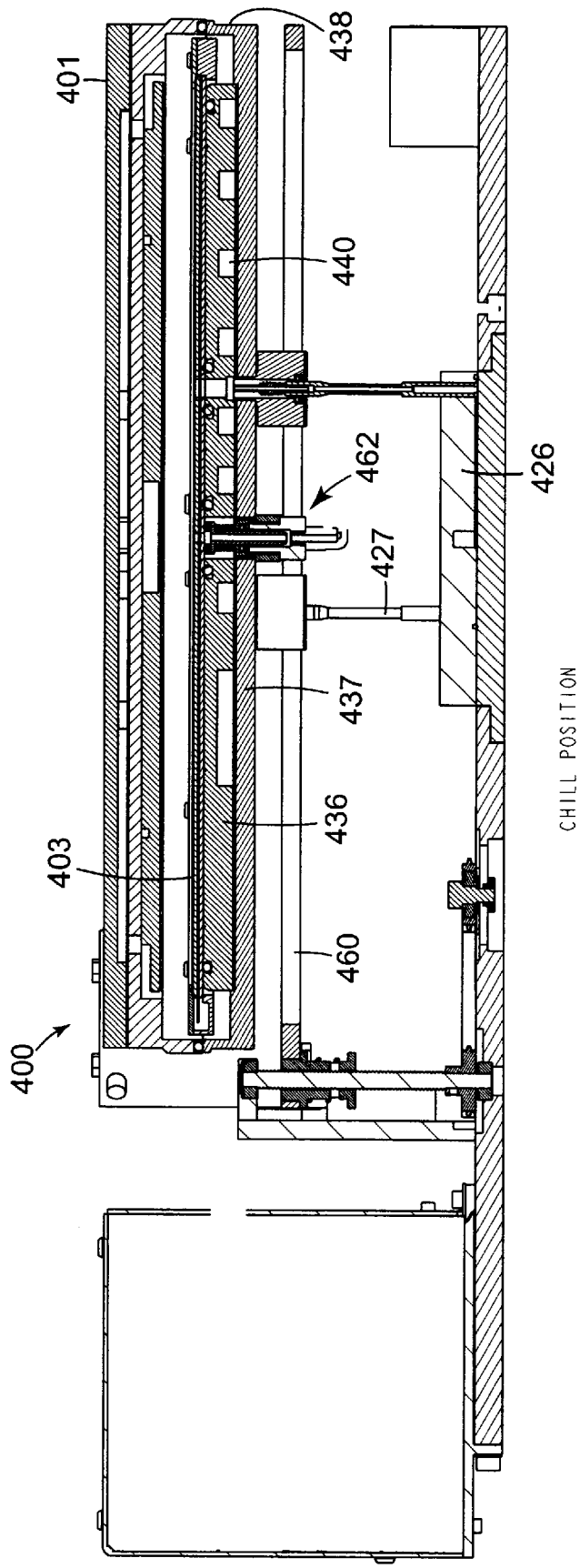
FIG. 12 is a cross-sectional side view of the bake/chill station of FIG. 10.
Figure 13:
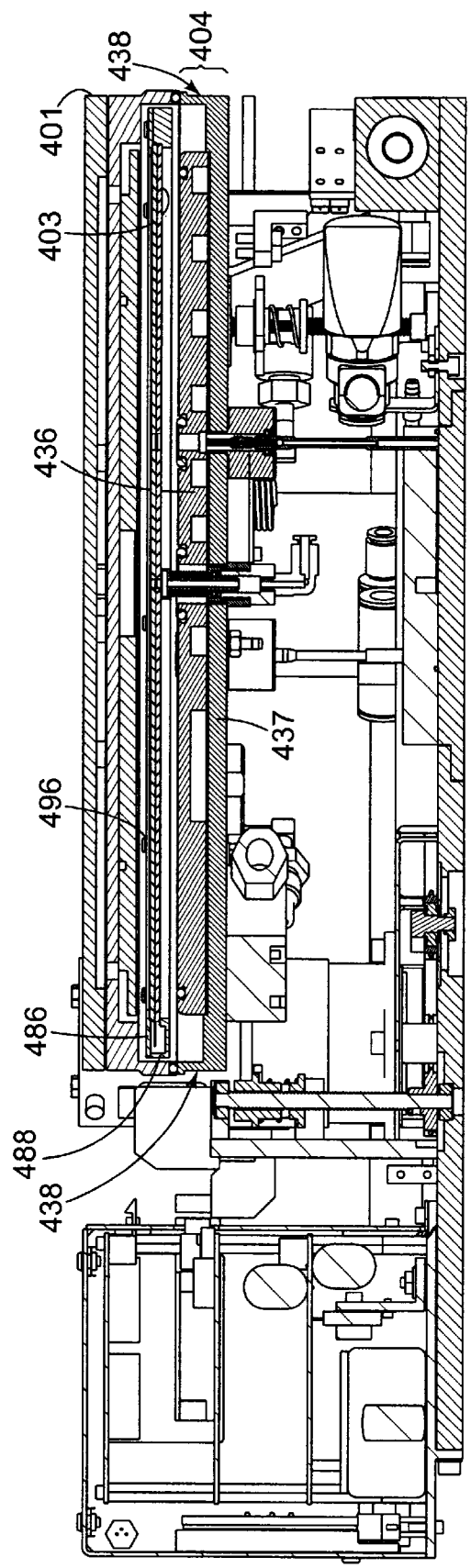
FIG. 13 is a cross-sectional side view of the bake/chill station of FIG. 10.

Bake/chill apparatus 400 includes a wafer support assembly, as shown in FIGS. 11–13. Referring to FIG. 11, lift pin base 426 supports a trio of lift pin shafts 427 arranged in triangular fashion at 120° intervals around lift pin base 426. Lift pins 428 extend from lift pin shafts 427 at a height appropriate for receiving wafer 540. Each shaft 427 and lift pin 428 has cooperating structure allowing spring 430 to fixedly hold lift pin 428 in place. Lift pin shafts 427 and lift pins 428 optionally may be hollow to allow a vacuum to be pulled against a wafer 540 supported on lift pins 428, if desired. Preferred embodiments of the apparatus can eliminate the need for vacuum.

As shown in FIG. 11, cooling member assembly 404 is in its lowest position in apparatus 400. Apparatus 400 is open, and wafer 540 can be easily inserted for processing. During baking and chilling operations, the components of cooling member assembly 404 can be moved upward until cooling member assembly 404 engages lid assembly 401. Any further upward movement of cooling member assembly 404 is constrained by this engagement. This action closes apparatus 400 and allows the wafer 540 to be baked and chilled in an environmentally sealed chamber. When baking and chilling are complete, cooling member assembly 404 can be lowered to open apparatus 400, allowing the processed wafer to be removed and another wafer to be inserted.

In more detail, cooling member 404 includes upper chill plate 436, lower chill plate 437, and sidewall member 438. The bottom surface 439 of upper chill plate 436 is grooved to define cooling media channels 440 when upper and lower chill plates 436 and 437 are assembled. Both upper and lower chill plates 436 and 437 are desirably formed from a thermally conductive material such as a metal, metal alloy or intermetallic composition of which metal alloys such as stainless steel, an aluminum alloy, or passivated (e.g., nickel-plated) copper are preferred.

The top of sidewall member 438 optionally may be grooved (not shown) to receive an O-ring (not shown) so that sidewall member 438 can sealingly engage lid assembly 401. Sidewall member 438 may be formed integrally with either upper chill plate 436 or lower chill plate 437, as shown, or can be formed as a separate piece. When formed separately, sidewall member 438 can be formed from a thermally conductive material such as stainless steel or aluminum, or can be formed from an insulating material such as polyimide, polyamide, polyamideimide, ultrahigh molecular weight polyethylene, or the like.

In terms of assembly, chill plates 436, 437, and sidewall member 438 (when formed as a separate piece) may be assembled to form cooling member 404 using any desired means such as screws, bolts, glue, welding, or the like. Upper and lower chill plates 436 and 437 preferably are structured to fit over lift pin shafts 427 and lift pins 428 so that cooling member 404 does not slideably engage lift pin shafts 427 or lift pins 428 during upward and downward movement of cooling member 404.

Apparatus 400 generally includes annular heater support ring 460 that serves as a base to support bakeplate subassembly 403 upon a trio of heater support shafts 464 fixedly mounted to annular heater support ring 460. Preferably, at least one of the heater support shafts may be hollow to provide a passage through which electrical wiring or the like can be guided for coupling to a bakeplate.

At the top end of each heater support shaft 464, the bakeplate 403 is secured using any suitable fastening technique. One approach is to use heater mounting screw threadably received in a corresponding threaded aperture at the top of each shaft. Thus, when heater support ring 460 is raised, the bakeplate is also raised. Similarly, when heater support ring 460 is lowered, the bakeplate is also lowered. This movement facilitates changing configurations of apparatus 400 between the loading/unloading, baking, and chilling configurations.

Cooling member subassembly 404 slidingly fits over the heater support shafts and is supported on the shafts between the bakeplate and heater support ring 460. The arrangement allows the bakeplate and cooling member to be raised together and further allows the bakeplate to be separately lowered onto or raised above cooling member 404 during baking and chilling operations. Springs 478 fit over heater support shafts 464 and are positioned between heater support ring 460 and cooling member 404. When apparatus 400 is in the loading/unloading configuration as illustrated in FIGS. 11 and 11a, springs 478 bias cooling member assembly 404 and bakeplate subassembly 403 together. The use of springs 478 is particularly advantageous, because they allow a simple, single lift mechanism to be used to easily place apparatus 400 into different operational configurations.

The features of bakeplate subassembly 403 are shown in FIGS. 11 and 11a. There, low thermal mass, planar bakeplate 403 (schematically shown as having a two layer laminate structure for purposes of clarity) is clamped between upper ring clamp 486 and lower ring clamp 488. Upper ring clamp 486 and lower ring clamp 488 are structured for snap fit engagement with each other and also can be further secured together by screws. Upper ring clamp 486 and lower ring clamp 488 can include a plurality of standoffs between which bakeplate 403 is supported, to minimize the area of direct contact with bakeplate 403. The use of standoffs can promote more uniform, more controllable baking and chilling operations.

Upper and lower ring clamps 486 and 488 may be formed of any suitable rigid, temperature resistant material. Particularly preferred materials are also good thermal insulators. Representative examples of such materials suitable for forming clamps 486 and 488 include polyimide, polyamide, alumina, synthetic quartz or other nonalkaline ceramic materials, combinations of these, and the like. One preferred polymeric clamp material is poly ethyl ethyl ketone from Bodecker Plastics Company, Austin, Tex.

As an alternative to the ring clamp of upper and lower ring clamps 486 and 488, other securing mechanisms may be used to secure the bakeplate 403. An example of one alternative would be a series of c-clamps or spring clamps positioned at three locations around the bakeplate, i.e., at the top of support posts 422. A ring-type clamp is preferred, however, because it can result in greater heating uniformity.

Bakeplate 403 includes a trio of through apertures 504 that allow the bakeplate to slideably fit over lift pins 428. (See, e.g., FIG. 5*d*.)

A preferred mode of operation of apparatus 400 will now be described with respect to FIGS. 11–13. In FIGS. 11 and 11*a*, apparatus 400 is in the loading/unloading configuration in which apparatus 400 is open allowing wafer 540 to be inserted and removed to and from the inside of apparatus 400. In this configuration, bakeplate 403 is pulled against the top of upper chill plate 436 by the action of springs 478, and lift pins 428 project well above bakeplate subassembly 403. This allows wafer 540 to be placed onto lift pins 428 for processing.

FIG. 12 shows apparatus 400 in the chill configuration. In changing apparatus 400 from the loading/unloading configuration to the chill configuration, bakeplate assembly 403 and cooling member assembly 404 move upward in concerted fashion. In the resultant chill configuration, wafer 540 is supported upon bakeplate 403, and bakeplate 403, in turn, is pulled against upper chill plate 436. In practical effect, upper chill plate 436 is in thermal contact with wafer 540 (not shown in FIG. 12) so that chill operations can now be carried out.

FIG. 13 shows apparatus 400 in the bake configuration. In this configuration, bakeplate 403 has been lifted out of thermal contact with upper chill plate 436 so that bake operations can now be carried out.

The bake/chill apparatus, as is known and will be well understood by the skilled artisan, can be used to process various substrates, e.g., microelectronic devices, through various process steps that induce or facilitate chemical reaction or that drive solvent out of coated materials. For example, the bake/chill apparatus can be used to coat and develop photoresist materials. In that application, a number of steps can involve temperature cycling of the workpiece, including steps commonly referred to as the "soft bake" step, the "post-exposure" bake step, and the "hardbake" step. The use of the described heating element can provide advantages in these process steps by causing relatively more uniform heat transfer between the heating element, the chill plate, and the workpiece.

While much of the description focuses on the use of the inventive heating member with a combination bake/chill apparatus, the invention is not limited to that application of the heating member, and the heating member is understood to be useful in various other applications and apparatuses that involve heating and cooling of a workpiece, especially where thermal precision and agility are advantageous. As just a single other example, the heating member may be used in a prime/chill apparatus, which is similar in construction and use to the bake/chill apparatus, but includes a few differences in respect to the chemistries, the composition of the workpiece (especially its surface), and possibly the temperatures that are involved. Briefly, a prime/chill apparatus has a construction that is similar to a bake/chill apparatus, but is designed to prime a surface of a semiconductor wafer for further processing. The priming step normally involves introducing a pure semiconductor wafer with a clean, uncoated surface into the apparatus chamber. The chamber is evacuated and hexane methyl di-silane (HMDS) is introduced, with changing temperature, precisely controlled by the apparatus and the bakeplate. The HMDS eliminates minute amounts of water from the surface of the wafer, making the surface hydrophobic, which facilitates subsequent processing.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

Flatness Measurement Procedure

The following materials and procedure were used to measure the flatness of substrates.

Materials Needed

Granite table (calibrated to better than 0.0001" flatness)

High precision standoffs (adjustable)

Dial indicator (accuracy better than 0.0005")

Procedure

Figure 14:
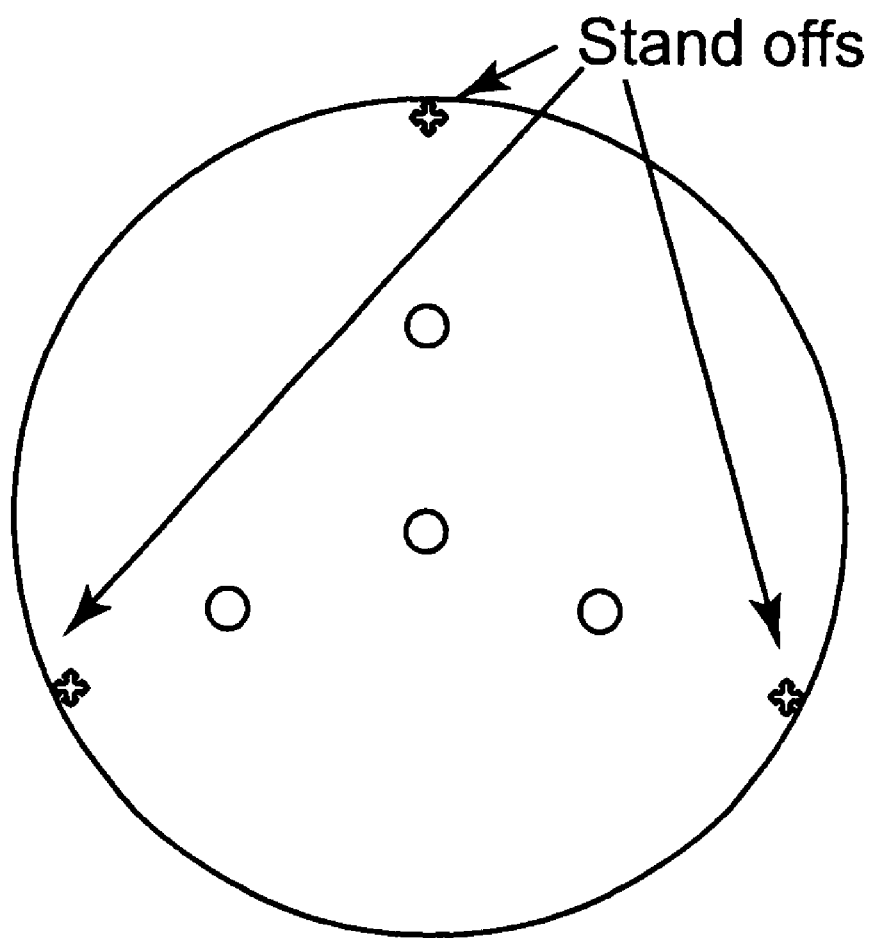
FIG. 14 is an illustration used in describing a flatness measurement procedure, and shows a top view of a substrate supported from beneath by stands, which allow taking measurements from below.

Place the high precision adjustable standoffs separated by 120 degrees so that the substrate can be supported on it at the outside edge of the substrate. Position the standoffs according to FIG. 14. Orient the substrate with the lift pin holes lined up with the standoffs. The point of support should be within 0.5" from the perimeter of the substrate. Using the dial indicator, zero out on the surface of the substrate at a location just on top of the substrate and near the first standoff. Move the dial indicator to the surface close to the second standoff and adjust the height of the standoff until the dial indicator reads zero. Repeat the procedure at the third point on top of the standoff. Move the dial indicator once again on top of all substrate near all the three standoffs and verify that the zero reading is unchanged. Run the dial indicator across the whole surface and note the minimum and maximum deviation from zero. The total range is the flatness of the surface of the substrate with respect to the plane created on the surface of the three standoffs.

What is claimed is:

1. A low thermal mass heating member comprising a thermally conductive aluminum nitride layer and a heating element, the thermally conductive layer having a supporting surface with a flatness of less than 0.01 inch and an opposing surface in thermal contact with a heating element, the heating element comprising multiple heating element segments.

2. The heating member of claim 1 having a diameter useful to support a 200 millimeter wafer substrate.

3. The heating member of claim 1 having a diameter useful to support a 300 millimeter wafer substrate.

4. The heating member of claim 1 wherein the supporting surface has a flatness of less than 0.005 inch.

5. The heating member of claim 4 having a diameter useful to support a 300 millimeter wafer substrate.

6. The heating member of claim 1 wherein the supporting surface has a flatness of less than 0.002 inch.

7. The heating member of claim 6 having a diameter useful to support a 300 millimeter wafer substrate.

8. A low thermal mass heating member comprising a heating element in thermal contact with a thermally conductive layer, wherein the thermally conductive layer comprises aluminum nitride, and wherein the heating element comprises multiple heating element segments.

9. The heating member of claim 8 wherein the thermally conductive layer consists essentially of aluminum nitride.

10. An apparatus suitable for controlling the temperature of a workpiece, the apparatus comprising:

(a) a low thermal mass, thermally conductive heating member comprising a rigid thermally conductive layer having a workpiece supporting surface adapted for supporting the workpiece in thermal contact with the heating member such that heat energy from the heating member can be transferred to the workpiece, wherein the thermally conductive layer comprises aluminum nitride; and (b) a high thermal mass chilling member;
wherein the apparatus supports the heating member and the chilling member in at least a first configuration in which the chilling member is in thermal contact with the heating member.

11. The apparatus of claim 10 wherein the apparatus further comprises a second configuration in which the heating member and the chilling member are thermally decoupled.

12. The apparatus of claim 10 wherein the workpiece comprises a microelectronic device.

13. The apparatus of claim 12 wherein the workpiece comprises a silicon wafer having a diameter in the range from about 200 to about 300 millimeters.

14. The apparatus of claim 13 wherein the supporting surface of the heating member has a flatness of less than 0.005 inch.

15. The apparatus of claim 10 wherein the apparatus comprises a combination bake/chill apparatus.

16. The apparatus of claim 10 wherein the apparatus comprises a prime/chill apparatus.

17. A combination bake/chill apparatus comprising a low thermal mass heating member comprising an aluminum nitride thermally conductive layer comprising a surface having a flatness of less than 0.01 inch.

18. The apparatus of claim 17 wherein the silicon carbide thermally conductive layer comprises a workpiece supporting surface and an opposing surface, the workpiece supporting surface being adapted for supporting the workpiece in thermal contact with the heating member such that heat energy from the heating member can be transferred to the workpiece, the opposing surface being in thermal contact with a multi-layer heating elememt comprising multiple electrically resistive heating element segments.

19. A combination prime/chill apparatus comprising a low thermal mass heating member comprising an aluminum nitride thermally conductive layer comprising a surface having a flatness of less than 0.005 inch.

20. The apparatus of claim 19 wherein the aluminum nitride thermally conductive layer comprises a workpiece supporting surface and an opposing surface, the workpiece supporting surface being adapted for supporting the workpiece in thermal contact with the heating member such that heat energy from the heating member can be transferred to the workpiece, the opposing surface being in thermal contact a multi-layer heating element comprising multiple electrically resistive heating element segments.

* * * * *

UNITED STATES PATENT AND TRADEMARK OFFICE
CERTIFICATE OF CORRECTION

PATENT NO.    : 6,639,189 B2
DATED         : October 28, 2003
INVENTOR(S)   : Ramanan et al.

It is certified that error appears in the above-identified patent and that said Letters Patent is hereby corrected as shown below:

<u>Title page,</u>
Item [56], References Cited, OTHER PUBLICATIONS, delete "20021" and insert in place thereof -- 2002 --.

Signed and Sealed this

Sixth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,639,189 B2
DATED : October 28, 2003
INVENTOR(S) : Ramanan et al.

It is certified that error appears in the above-identified patent and that said Letters Patent is hereby corrected as shown below:

Title page,
Item [56], References Cited, OTHER PUBLICATIONS, delete "20021" and insert in place thereof -- 2002 --.

Column 32,
Line 1, delete "silicon carbide" and insert in place thereof -- aluminum nitride --

This certificate supersedes Certificate of Correction issued April 6, 2004.

Signed and Sealed this

Twentieth Day of April, 2004

JON W. DUDAS
*Acting Director of the United States Patent and Trademark Office*